US012563926B2

(12) United States Patent
Jung et al.

(10) Patent No.: US 12,563,926 B2
(45) Date of Patent: Feb. 24, 2026

(54) DISPLAY DEVICE HAVING A SECOND CONTACT HOLE PASSING THROUGH THE FIRST INSULATING LAYER AND MANUFACTURING METHOD THEREOF

(71) Applicant: Samsung Display Co., Ltd., Yongin-Si (KR)

(72) Inventors: Dawoon Jung, Hwaseong-si (KR); Yu-Gwang Jeong, Anyang-si (KR); Su Bin Bae, Hwaseong-si (KR); Sung Won Cho, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 373 days.

(21) Appl. No.: 18/094,393

(22) Filed: Jan. 9, 2023

(65) Prior Publication Data

US 2023/0240104 A1 Jul. 27, 2023

(30) Foreign Application Priority Data

Jan. 24, 2022 (KR) ........................ 10-2022-0010189

(51) Int. Cl.
*H10K 59/12* (2023.01)
*G09G 3/3233* (2016.01)
*H10K 59/131* (2023.01)

(52) U.S. Cl.
CPC ......... *H10K 59/131* (2023.02); *G09G 3/3233* (2013.01); *H10K 59/1201* (2023.02); *G09G 2300/0426* (2013.01); *G09G 2300/0819* (2013.01); *G09G 2300/0842* (2013.01); *G09G 2300/0861* (2013.01)

(58) Field of Classification Search
CPC ............ H10K 59/131; H10K 59/1201; G09G 3/3233; G09G 2300/0426; G09G 2300/0819; G09G 2300/0842; G09G 2300/0861
USPC ......................................................... 257/72
See application file for complete search history.

(56) References Cited

U.S. PATENT DOCUMENTS

2021/0083035 A1   3/2021   Yun et al.
2021/0134916 A1   5/2021   Lee et al.

FOREIGN PATENT DOCUMENTS

| JP | 3675453 | B2 | * | 7/2005 | ............ H10D 1/682 |
| JP | 2020-043181 | A | | 3/2020 | |
| KR | 10-2019-0065679 | A | | 6/2019 | |
| KR | 20190079828 | | * | 7/2019 | |

(Continued)

*Primary Examiner* — Phuc T Dang
(74) *Attorney, Agent, or Firm* — Innovation Counsel LLP

(57) ABSTRACT

A display device includes the following elements: a semiconductor layer positioned on a substrate; a first gate insulating layer positioned on the semiconductor layer; a first gate conductive layer positioned on the first gate insulating layer; a second gate insulating layer positioned on the first gate conductive layer; a second gate conductive layer positioned on the second gate insulating layer; a first insulating layer positioned on the second gate conductive layer; a first contact hole passing through the first insulating layer, the second gate insulating layer, and the first gate insulating layer; a second contact hole passing through the first insulating layer; and a third contact hole passing through the first insulating layer and the second gate insulating layer. A cross-section of the first insulating layer in a plane perpendicular to the substrate has a curved profile.

9 Claims, 28 Drawing Sheets

(56)          References Cited

FOREIGN PATENT DOCUMENTS

| KR | 10-2021-0033581 A | 3/2021 |
| KR | 10-2021-0054113 A | 5/2021 |
| KR | 10-2267299 B1 | 6/2021 |

* cited by examiner

DISPLAY DEVICE HAVING A SECOND CONTACT HOLE PASSING THROUGH THE FIRST INSULATING LAYER AND MANUFACTURING METHOD THEREOF

CROSS-REFERENCE TO RELATED APPLICATION

This application claims priority to Korean Patent Application No. 10-2022-0010189 filed in the Korean Intellectual Property Office on Jan. 24, 2022; the Korean Patent Application is incorporated herein by reference.

BACKGROUND

(a) Field of the Invention

The present disclosure relates to a display device and a manufacturing method of the display device.

(b) Description of the Related Art

A display device may display images in response to input signals. Display devices include liquid crystal display (LCD) devices and light emitting diode (LED) display devices. Display devices are used in various electronic devices, such as mobile phones, navigation devices, digital cameras, electronic books, portable game machines, and terminals.

A light emitting diode typically includes two electrodes and a light emitting layer interposed between the two electrodes. Electrons injected from one electrode and holes injected from another electrode are combined in the light emitting layer to generate excitons, and the generated excitons release energy to emit light.

A light emitting diode display typically includes a plurality of pixels. Each of the pixels may include a light emitting diode and may include thin film transistors and one or more capacitors for driving the light emitting diode. The thin film transistors include a switching transistor and a driving transistor.

The Background section is for enhancement of understanding of the background of the application. The Background section may contain information that does not form the prior art that is already known in this country to a person of ordinary skill in the art.

SUMMARY

Embodiments may be related to a method for manufacturing a display device. The method may include simultaneously etching a plurality of insulating layers in a process of forming contact holes. According to embodiments, desirable characteristics of a semiconductor layer and/or a conductive layer exposed by the contact holes may be attained. Embodiment may be related to the display device.

An embodiment may be related to a display device. The display device may include the following elements: a semiconductor layer positioned on a substrate; a first gate insulating layer positioned on the semiconductor layer; a first gate conductive layer positioned on the first gate insulating layer; a second gate insulating layer positioned on the first gate conductive layer; a second gate conductive layer positioned on the second gate insulating layer; a first insulating layer positioned on the second gate conductive layer; a first contact hole passing through the first insulating layer, the second gate insulating layer, and the first gate insulating layer; a second contact hole passing through the first insulating layer; and a third contact hole passing through the first insulating layer and the second gate insulating layer. A cross-section of the first insulating layer in a plane perpendicular to the substrate may have one or more curved profiles that are sidewall sections of contact holes.

The display device may further include a data conductive layer positioned on the first insulating layer. The data conductive layer may include a source electrode electrically connected to the semiconductor layer through the first contact hole, a first connection electrode electrically connected to the second gate conductive layer through the second contact hole, and a second connection electrode electrically connected to the first gate conductive layer through the third contact hole.

An interface between the data conductive layer and the first insulating layer may include fluorine, a fluorine-based compound, and/or CFx, wherein the x is a natural number of 1 or more.

The semiconductor layer may have a first thickness in an area overlapping (and exposed by) the first contact hole, and a second thickness in another area of the semiconductor layer, and the second thickness may be larger than the first thickness.

The semiconductor layer may include a first face, a second face, and third face. The first face may be opposite each of the second face and the third face. The second face may be exposed by the first contact hole. The semiconductor layer may have a first thickness measured from the first face to the second face. The semiconductor layer may have a second thickness measured from the first face to the third face. The second thickness is larger/greater than the first thickness.

The semiconductor layer may include a first groove overlapping the first contact hole.

The semiconductor layer may include a first groove. The first groove may be part of the first contact hole.

The first gate conductive layer includes a first gate conductive member exposed by the third contact hole. The first gate conductive member may include a first gate conductive sub-member and a second gate conductive sub-member. The third contact hole may extend through the second gate conductive sub-member.

The second gate conductive layer may include a second gate conductive member exposed by the second contact hole. The second gate conductive member may include a third gate conductive sub-member and a fourth gate conductive sub-member. The second contact hole may extend through the fourth gate conductive sub-member.

Each of the first gate conductive sub-member and the third gate conductive sub-member may include aluminum. Each of the second gate conductive sub-member and the fourth gate conductive sub-member may include titanium.

The display device may include an auxiliary layer positioned between the data conductive layer and the first insulating layer.

The auxiliary layer may include amorphous silicon.

An embodiment may be related to a method for manufacturing a display device. The method may include the following steps: forming a semiconductor layer on a substrate; forming a first gate insulating layer on the semiconductor layer; forming a first gate conductive layer on the first gate insulating layer; forming a second gate insulating layer on the first gate conductive layer; forming a second gate conductive layer on the second gate insulating layer; forming a first insulating layer on the second gate conductive layer; forming contact holes by etching at least one of the first gate insulating layer, the second gate insulating layer, and the first insulating layer; annealing the semiconductor layer; and removing a portion of the first gate insulating layer after the annealing.

The first insulating layer is partially removed when the portion of the first gate insulating layer is removed. A first contact hole passing through the first insulating layer, the second gate insulating layer, and the first gate insulating layer may be formed when the portion of the first gate insulating layer is removed.

After the first insulating layer is partially removed, a cross-section of the first insulating layer in a plane perpendicular to the substrate may have curved profiles that are sidewall sections of the contact holes.

The method may further include forming a data conductive layer on the first insulating layer. The data conductive layer may include a source electrode electrically connected to the semiconductor layer, a first connection electrode electrically connected to the second gate conductive layer, and a second connection electrode electrically connected to the first gate conductive layer.

An interface between the data conductive layer and the first insulating layer may include fluorine, a fluorine-based compound, and/or $CF_x$, wherein the x is a natural number of 1 or more.

The semiconductor layer may have a first thickness in an area overlapping (and exposed by) the first contact hole, and a second thickness in another area of the semiconductor layer, and the second thickness may be larger than the first thickness.

The semiconductor layer may include a first face, a second face, and third face. The first face may be opposite each of the second face and the third face. The second face may be exposed by the first contact hole. The semiconductor layer may have a first thickness measured from the first face to the second face. The semiconductor layer may have a second thickness measured from the first face to the third face. The second thickness is larger/greater than the first thickness.

The semiconductor layer may include a first groove overlapping the first contact hole.

The semiconductor layer may include a first groove. The first groove may be part of the first contact hole.

The method may further include forming an auxiliary material layer on the first insulating layer.

The method may further include forming a data conductive layer on the first insulating layer. The data conductive layer may include a source electrode electrically connected to the semiconductor layer, a first connection electrode electrically connected to the second gate conductive layer, and a second connection electrode electrically connected to the first gate conductive layer.

In the forming of the data conductive layer, the auxiliary material layer may be patterned to form an auxiliary layer positioned between the first insulating layer and the data conductive layer.

According to embodiments, in a display device, reliability, stability, and/or other desirable characteristics of a conductive layer and/or a semiconductor layer exposed by contact holes may be attained.

BRIEF DESCRIPTION OF THE DRAWINGS

FIG. 4, FIG. 5, FIG. 6, FIG. 7, FIG. 8, FIG. 9, and FIG. 10 each illustrate a cross-sectional view of a structure related to a manufacturing method of a display device according to an embodiment.

FIG. 11 illustrates a cross-sectional view of a display device according to an embodiment.

FIG. 12, FIG. 13, FIG. 14, FIG. 15, and FIG. 16 each illustrate a cross-sectional view of a structure related to a manufacturing process of a display device according to an embodiment.

DETAILED DESCRIPTION OF EMBODIMENTS

Figure 1:
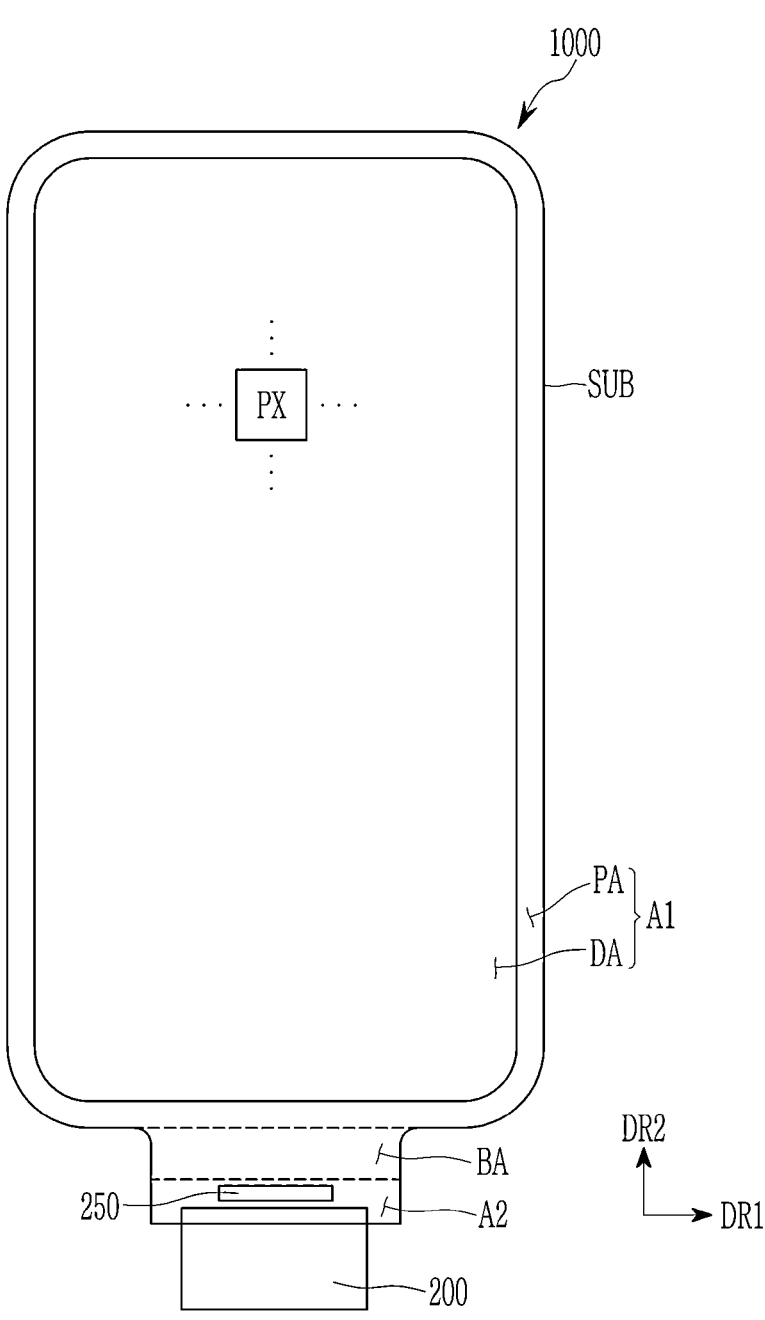
FIG. 1 illustrates a top plan view of a display device according to an embodiment.

Examples of embodiments are described with reference to the accompanying drawings. The described embodiments may be modified in various ways, all without departing from the scope of practical embodiments.

Identical or similar elements may be denoted by the same reference numerals.

Further, in the drawings, dimensions of elements may be exaggerated for clarity and may not limit the described embodiments. Features described with reference to a figure may be applicable to one or more other figures.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The term "on" may mean "directly on" or "indirectly on." The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" may mean "immediately adjacent." The expression that an element extends in a particular direction may mean that the element extends lengthwise in the particular direction and/or that the lengthwise direction of the element is in the particular direction. The term "pattern" may mean "member." The expression that a space or opening overlaps an object may mean that (the position of) the space or opening overlaps with (the position of) the object. The term "overlap" may be equivalent to "be overlapped by." The expression that a first element overlaps with a second element in a plan view may mean that the first element overlaps the second element in direction perpendicular to a substrate.

Unless explicitly described to the contrary, the word "comprise" and variations such as "comprises" or "comprising" indicate the inclusion of stated elements but may not indicate the exclusion of any other elements.

FIG. 1 illustrates a top plan view of a display device 1000 according to an embodiment.

The display device 1000 includes a substrate SUB and a plurality of pixels PX positioned on the substrate SUB. The substrate SUB may include a first area A1, a second area A2, and a bending area BA positioned between the first area A1 and the second area A2.

The substrate SUB may be made of a flexible material, and may be changed into various shapes. The substrate SUB may be flexible, stretchable, foldable, bendable, and/or rollable. The bending area BA may be bent. The first area A1 and the second area A2 may be flat. The substrate SUB may additionally include one or more bending areas. For example, at least a portion of the first area A1 or the second area A2 may be bent.

The first area A1 may substantially have a rectangular shape including long sides and short sides, and may have one or more chamfered and/or rounded corners. The first area A1 is only an example, and may have one or more other shapes. The first area A1 may include a display area DA and a peripheral area PA. The display area DA may be positioned in a central portion of the first area A1, and may have a shape that is substantially similar to that of the first area A1. The peripheral area PA may surround the display area DA. The peripheral area PA may be positioned outside the first area A1.

A plurality of pixels PX may be positioned in the display area DA. The plurality of pixels PX may be disposed in a matrix or an alternative arrangement, and may receive signals and display an image according to the received signals. Although not shown, the display device 1000 may further include a plurality of signal lines. The signal lines may extend in a first direction DR1 or a second direction DR2. The first direction DR1 may be a pixel row direction, and the second direction DR2 may be a pixel column direction. Each pixel PX may include a plurality of transistors, capacitors, and at least one light emitting diode that are connected to some of the signal lines. The display device 1000 may be/include an organic light emitting display device and/or a different type of display device. The display device may be/include a liquid crystal display, an electrophoretic display, and/or an electrowetting display device. The display device may be/include a micro light emitting diode (LED) display device, a quantum dot light emitting diode (QLED) display device, and/or a quantum dot organic light emitting diode (QD-OLED) display device.

The second area A2 is a non-display area that does not include pixels for displaying an image in response to signals. Elements and/or wires for generating and/or transmitting various signals applied to the pixel PX are positioned in the second area A2.

A driving circuit chip 250 and a flexible circuit board 200 may be positioned on the second area A2. The driving circuit chip 250 is connected to the elements and/or wires positioned in the second area A2 to provide signals to the plurality of pixels PX. The driving circuit chip 250 may supply a scan signal, a control signal, a data signal, and the like. The flexible circuit board 200 may be attached to an edge of the second area A2. The flexible circuit board 200 may include a substrate made of a flexible material. The flexible circuit board 200 has a circuit designed to control an operation of the display device.

The bending area BA of the substrate SUB may be positioned between the first area A1 and the second area A2 and may connect the first area A1 and the second area A2 to each other. When the substrate SUB is bent, the first area A1 and the second area A2 may overlap each other. The bending area BA may be connected to one or more short sides and/or one or more long sides of the first area A1.

Figure 2:
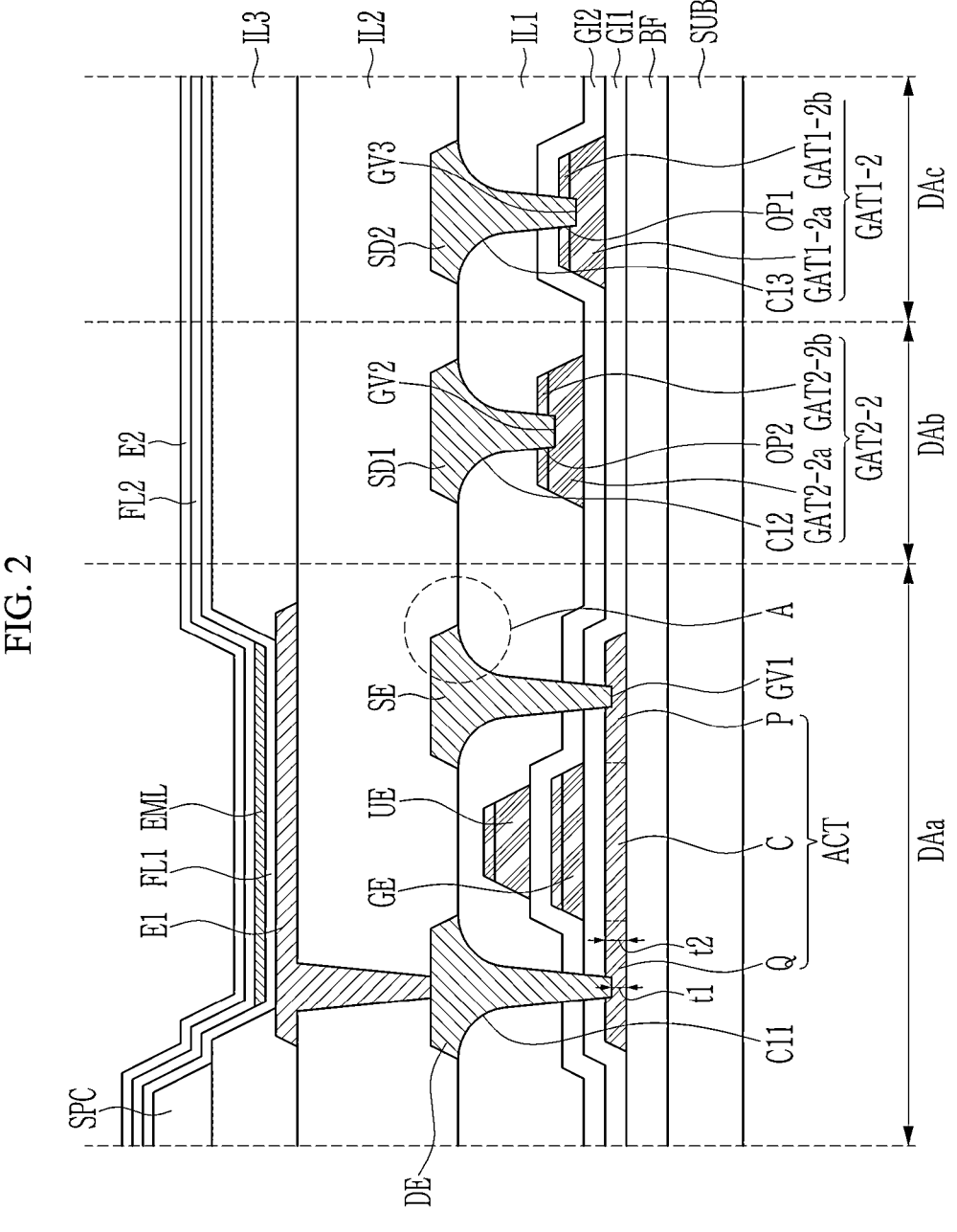
FIG. 2 illustrates a cross-sectional view of a display device according to an embodiment.
Figure 3:
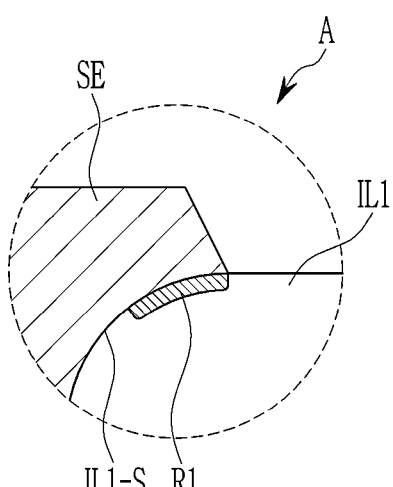
FIG. 3 illustrates an enlarged view of a portion A of a display device according to an embodiment.

FIG. 2 illustrates a cross-sectional view of a display device according to an embodiment, and FIG. 3 illustrates an enlarged view of a portion A according to an embodiment.

The display device includes a substrate SUB. The substrate SUB may include an inorganic insulating material such as glass and/or an organic insulating material such as plastic such as polyimide (PI). The substrate SUB may be single-layered or multi-layered. The substrate SUB may have a structure in which at least one base layer and at least one inorganic layer disposed on the at least one base layer.

The substrate SUB may have a predetermined degree of flexibility. The substrate SUB may be a rigid substrate, or may be a flexible substrate that is bendable, foldable, and/or rollable.

The substrate SUB may include a first display area DAa in which a transistor is disposed, a second display area Dab in which at least a portion of a second gate conductive layer is positioned, and a third display area DAc in which at least a portion of a first gate conductive layer is positioned.

A buffer layer BF may be positioned on the substrate SUB. The buffer layer BF blocks impurities from being transmitted from the substrate SUB to one or more layers overlying the buffer layer BF, particularly a semiconductor layer ACT, thereby preventing characteristic degradation of the semiconductor layer ACT. The buffer layer BF may include an inorganic insulating material such as a silicon nitride or a silicon oxide, and/or may include an organic insulating material. The buffer layer BF may be optional.

The semiconductor layer ACT is disposed on the buffer layer BF. The semiconductor layer ACT may include at least one of polycrystalline silicon and an oxide semiconductor. The semiconductor layer ACT includes a channel area C, a first area P, and a second area Q. The first area P and the second area Q are disposed at opposite sides of the channel area C, respectively. The channel area C may include a semiconductor with a small amount of impurity doped or a semiconductor with no impurity doped. The first area P and the second area Q may include semiconductors with a larger amount of impurity doped than the channel area C.

The semiconductor layer ACT may include a first groove GV1 overlapping a first contact hole C11. The semiconductor layer ACT may have a first thickness t1 in an area overlapping the first contact hole C11, and may have a second thickness t2 in other areas. The first thickness t1 may be smaller than the second thickness t2. The semiconductor layer ACT may be partially etched in an etching process for forming the contact hole, such that the groove GV1 is formed.

A first gate insulating layer GI1 is positioned on the semiconductor layer ACT. The first gate insulating layer GI1 may be a single layer or multilayer structure including at least one of a silicon oxide ($SiO_x$), a silicon nitride ($SiN_x$), and a silicon oxynitride ($SiO_xN_y$).

A first gate conductive layer GAT1 (indicated in FIG. 4) is positioned on the first gate insulating layer GI1. The first gate conductive layer GAT1 may include a gate electrode GE positioned in the first display area DAa, and a first gate conductive member GAT1-2 positioned in the third display area DAc. The gate electrode GE may overlap the channel area C of the semiconductor layer ACT.

The first gate conductive layer GAT1 may be a single layer or multilayer structure and may include one or more metal films containing at least one of copper (Cu), a copper alloy, aluminum (Al), an aluminum alloy, molybdenum (Mo), a molybdenum alloy, titanium (Ti), and a titanium alloy.

The first gate conductive member GAT1-2 may include a first gate conductive sub-member GAT1-2a and a second gate conductive sub-member GAT1-2b. The first gate conductive sub-member GAT1-2a may be positioned between the first gate insulating layer GI1 and the second gate conductive sub-member GAT1-2b. The second gate conductive sub-member GAT1-2b may be thinner than the first gate conductive sub-member GAT1-2a in a direction perpendicular to the substrate SUB. The first gate conductive sub-member GAT1-2a may include aluminum, and the second gate conductive sub-member GAT1-2b may include titanium. In first gate conductive member GAT1-2 the gate electrode GE may be manufactured in the same process and may have the same stacked structure.

The second gate conductive sub-member GAT1-2b may include a first opening overlapping a third contact hole C13. The first gate conductive sub-member GAT1-2a may include a third groove GV3 overlapping the third contact hole C13.

A second gate insulating layer GI2 may be positioned on the first gate conductive layer GAT1 and the first gate insulating layer GI1. The second gate insulating layer GI2 may be a single layer or multilayer structure including at least one of a silicon oxide ($SiO_x$), a silicon nitride ($SiN_x$), and a silicon oxynitride ($SiO_xN_y$).

A second gate conductive layer GAT2 (indicated in FIG. 4) may include an upper electrode UE positioned in the first display area DAa, may include a second gate conductive member GAT2-2 positioned in the second display area Dab, and may be positioned on the second gate insulating layer GI2.

The upper electrode UE may form a storage capacitor with the underlying gate electrode GE (or a lower electrode).

The second gate conductive member GAT2-2 may include a third gate conductive sub-member GAT2-2a and a fourth gate conductive sub-member GAT2-2b. The third gate conductive sub-member GAT2-2a may be positioned between the second gate insulating layer GI2 and the fourth gate conductive sub-member GAT2-2b. The fourth gate conductive sub-member GAT2-2b may be thinner than the third gate conductive sub-member GAT2-2a in a direction perpendicular to the substrate SUB. The third gate conductive sub-member GAT2-2a may include aluminum, and the fourth gate conductive sub-member GAT2-2b may include titanium. The second gate conductive member GAT2-2 and the upper electrode UE) may be formed in the same process and may have the same stacked structure.

The fourth gate conductive sub-member GAT2-2b may include a second opening OP1 overlapping a second contact hole C12. The (2-2a)-th gate conductive layer GAT2-2a may include a second groove GV2 overlapping the second contact hole C12.

A first insulating layer IL1 is positioned on the second gate conductive layer GAT2 and the second gate insulating layer GI2. The first insulating layer IL1 may be a single layer or multilayer structure including at least one of a silicon oxide ($SiO_x$), a silicon nitride ($SiN_x$), and a silicon oxynitride ($SiO_xN_y$).

The first insulating layer IL1 may include smooth curved sidewall sections of the contact holes C11, C12, and C13 in a cross-sectional view of the display device in a plane perpendicular to the substrate SUB.

A data conductive layer may be positioned on the first insulating layer IL1.

The data conductive layer may include a source electrode SE and a drain electrode DE positioned in the first display area DAa, may include a first connection electrode SD1 positioned in the second display area DAb, and may include a second connection electrode SD2 positioned in the third display area DAc.

The source electrode SE and the drain electrode DE are respectively connected to the first area P and the second area Q of the semiconductor layer ACT through the first contact holes C11 formed in the first insulating layer ILL the second gate insulating layer GI2, and the first gate insulating layer GI1.

The first connection electrode SD1 may be connected to the second gate conductive member GAT2-2 through the second contact hole C12 formed in the first insulating layer IL1. The first connection electrode SD1 may pass through the fourth gate conductive sub-member GAT2-2b to directly contact an upper surface of the third gate conductive sub-member GAT2-2a. The first connection electrode SD1 may fill the second groove GV2.

The second connection electrode SD2 may be connected to the first gate conductive member GAT1-2 through the third contact hole C13 formed in the first insulating layer IL1 and the second gate insulating layer GI2. The second connection electrode SD2 may pass through the second gate conductive sub-member GAT1-2b to directly contact an upper surface of the first gate conductive sub-member GAT1-2a. The second connection electrode SD2 may fill the third groove GV3.

The data conductive layer may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may have a single-layered or multi-layered structure including one or more of the above materials-.

Referring to FIG. 3, at least a (curved) portion R1 of an upper surface IL1-S of the first insulating layer IL1 in contact with the data conductive layer may include fluorine (F), a fluorine-based compound, or CFx, wherein x may be a natural number greater than or equal to 1.

Fluorine, a fluorine-based compound, or a CFx polymer may remain in/on the upper surface of the first insulating layer IL1 during the manufacturing process. The fluorine, the fluorine-based compound, or the CFx polymer may overlap (and directly contact) the data conductive layer. In the patterning (e.g., etching) process of the data conductive layer, fluorine, a fluorine-based compound, or a CFx polymer not overlapping the data metal layer may be removed in the patterning process.

Referring back to FIG. 2, a second insulating layer IL2 is positioned on the first insulating layer IL1 and the data conductive layer.

The second insulating layer IL2 may include an organic insulating material such as a general purpose polymer such as poly(methyl methacrylate) (PMMA) or polystyrene (PS), a polymer derivative having a phenolic group, a acryl-based polymer, an imide-based polymer, a polyimide, an acryl-based polymer, and/or a siloxane-based polymer. The second insulating layer IL2 may be a single layer or a multilayer structure.

A first electrode E1 is disposed on the second insulating layer IL2. The first electrode E1 is electrically connected to the drain electrode DE through a contact hole of the second insulating layer IL2.

The first electrode E1 may include a metal such as silver (Ag), lithium (Li), calcium (Ca), aluminum (Al), magnesium (Mg), or gold (Au), and/or may include a transparent conductive oxide (TCO) such as an indium tin oxide (ITO) or an indium zinc oxide (IZO). The first electrode E1 may be a single layer or multilayer structure including a metal material and/or a transparent conductive oxide. The first electrode E1 may have a triple-layered structure of indium tin oxide (ITO), silver (Ag), and indium tin oxide (ITO).

A transistor comprising the gate electrode GE, the semiconductor layer ACT, the source electrode SE, and the drain electrode DE is connected to the first electrode E1 to supply a current to a light emitting element that comprises the first electrode E1.

A partition wall IL3 is disposed on the second insulating layer IL2 and the first electrode E1.

The partition wall IL3 overlaps at least a portion of the first electrode E1, and has an opening defining a light emitting region. The opening may have a shape substantially similar to that of the first electrode E1 in a plan view of the display device. The opening may have a circular shape, a rhombus shape, an octagonal shape, a rectangular shape, a polygonal shape, and/or an elliptical shape in the plan view of the display device.

The partition wall IL3 may include an organic insulating material and/or may include an inorganic insulating material such as a silicon nitride, a silicon oxynitride, or a silicon oxide. The partition wall IL3 may include a light-blocking material and may be provided in black. The light blocking material may include carbon black, a carbon nanotube, a resin or paste containing a black dye, metal particles of nickel, aluminum, molybdenum, and/or an alloy, metal oxide particles (for example, chromium oxide particles), and/or metal nitride particles (for example, chromium nitride particles). When the partition wall IL3 includes a light blocking material, reflection of external light by metal structures disposed under the partition wall IL3 may be reduced. The partition wall IL3 may include a light transmitting organic insulating material without including a light blocking material.

A spacer SPC may be disposed on the partition wall IL3. The spacer SPC may include an organic insulating material such as polyimide and/or may include an inorganic insulating material such as a silicon nitride ($SiN_x$) or a silicon oxide ($SiO_2$).

The spacer SPC may include the same material as the partition wall IL3. The partition wall IL3 and the spacer SPC may be formed together in a mask process using a half tone mask or the like. The partition wall IL3 and the spacer SPC may include different materials.

A light emitting layer EML is positioned on the first electrode E1. The light emitting layer EML may include an organic material and/or an inorganic material. The light emitting layer EML may generate predetermined colored light. The light emitting layer EML may be formed only within the opening of the partition wall using a mask or an inkjet process.

A first functional layer FL1 may be positioned between the light emitting layer EML and the first electrode E1, and a second functional layer FL2 may be positioned between the light emitting layer EML and the second electrode E2.

The first functional layer FL1 may include at least one of a hole injection layer (HIL) and a hole transporting layer (HTL), and the second functional layer FL2 may include at least one of an electron transporting layer (ETL) and an electron injection layer (EIL).

A light emitting layer EML is in the opening of the partition wall IL3 for each corresponding pixel. Each of the first functional layer FL1 and the second functional layer FL2 may be shared by multiple pixels. Each of the first functional layer FL1 and the second functional layer FL2 may substantially cover the display area DA of the substrate SUB.

The second electrode E2 is positioned on the emission layer EML. The second electrode E2 may include a reflective metal including calcium (Ca), barium (Ba), magnesium (Mg), aluminum (Al), silver (Ag), gold (Au), nickel (Ni), chromium (Cr), lithium (Li), calcium (Ca), and/or molybdenum (Mo), and/or may include a transparent conductive oxide (TCO) such as an indium tin oxide (ITO) or an indium zinc oxide (IZO).

The first electrode E1, the emission layer EML, and the second electrode E2 may constitute a light emitting element. Holes and electrons are injected into the light emitting layer EML from the first electrode E1 and second electrode E2, respectively, and light is emitted when excitons resulted from the combination of the injected holes and electrons enter a ground state from an excited state.

FIG. 4 to FIG. 10 each illustrate a cross-sectional view of a structure related to a manufacturing method of a display device according to an embodiment.

Figure 4:
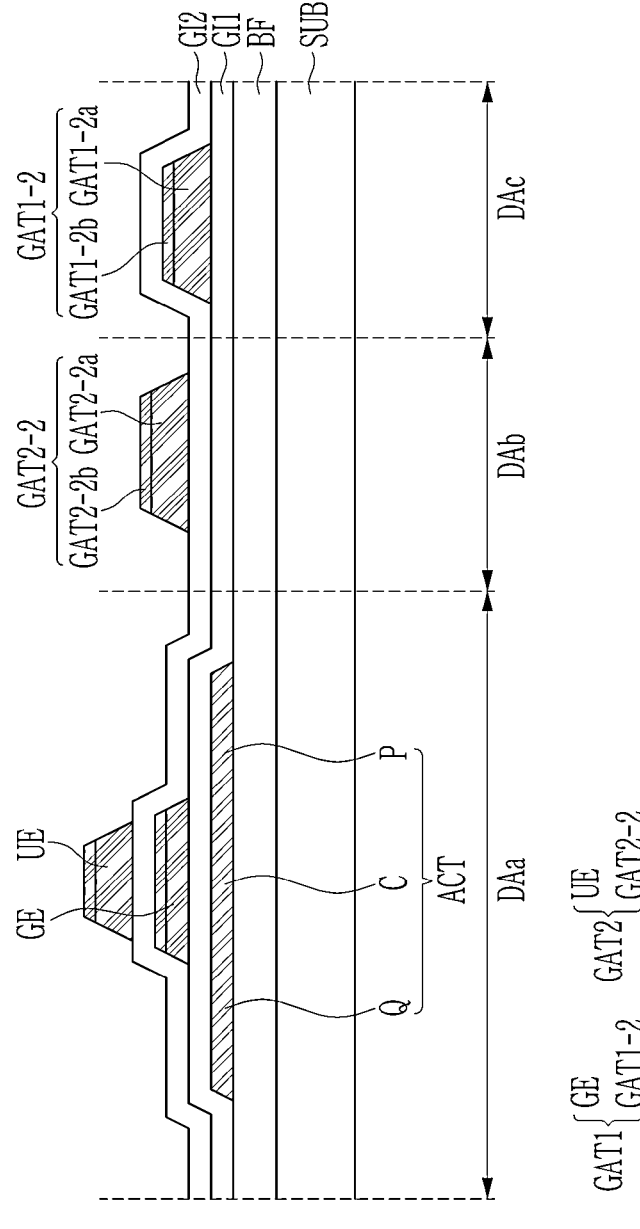

Referring to FIG. 4, the buffer layer BF positioned on an entire surface of the substrate SUB is formed. Subsequently, the semiconductor layer ACT positioned in the first display area DAa is formed, and the first gate insulating layer GI1 positioned on the entire surface of the substrate SUB is formed. Thereafter, the first gate conductive layer GAT1 positioned on the first gate insulating layer GI1 is formed. The first gate conductive layer GAT1 may include the gate electrode GE positioned in the first display area DAa, and may include the first gate conductive member GAT1-2 positioned in the third display area DAc. Subsequently, the second gate insulating layer GI2 overlapping the entire surface of the substrate SUB is formed on the first gate conductive layer GAT1. The second gate conductive layer GAT2 is formed on the second gate insulating layer GI2. The second gate conductive layer GAT2 may include the upper electrode UE overlapping the first display area DAa and may include the second gate conductive member GAT2-2 overlapping the second display area DAb.

Figure 5:
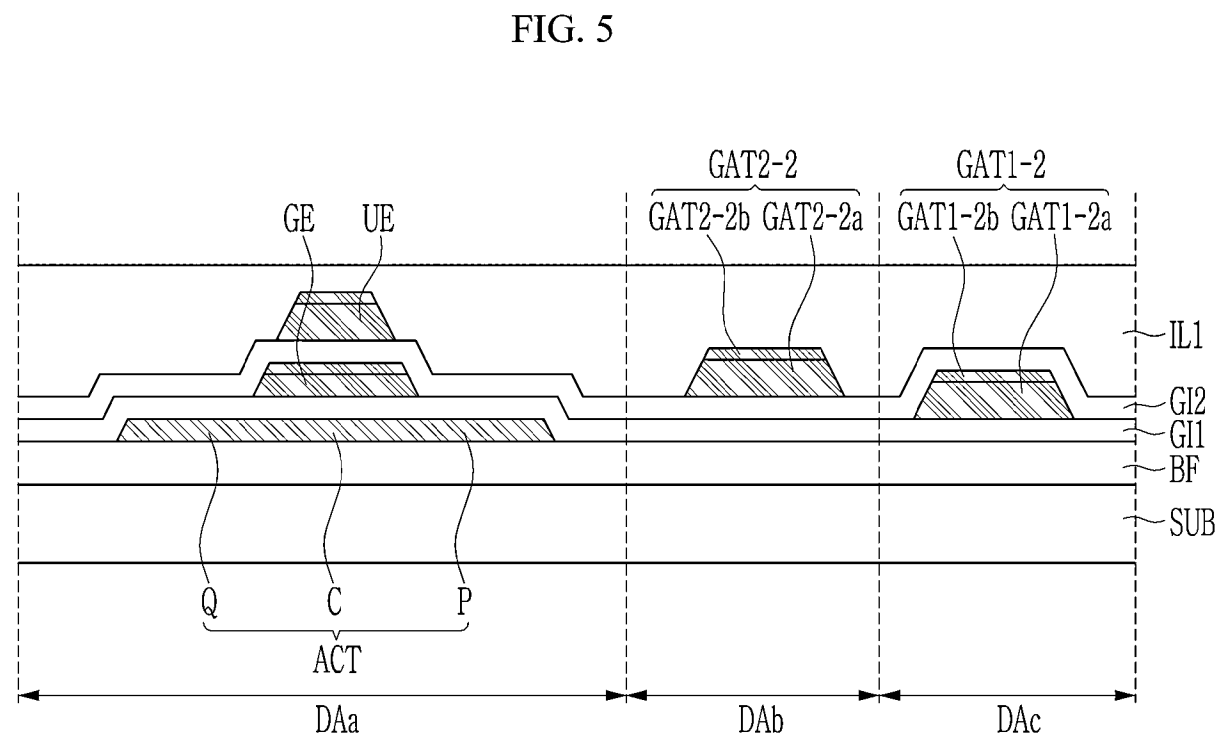
Figure 6:
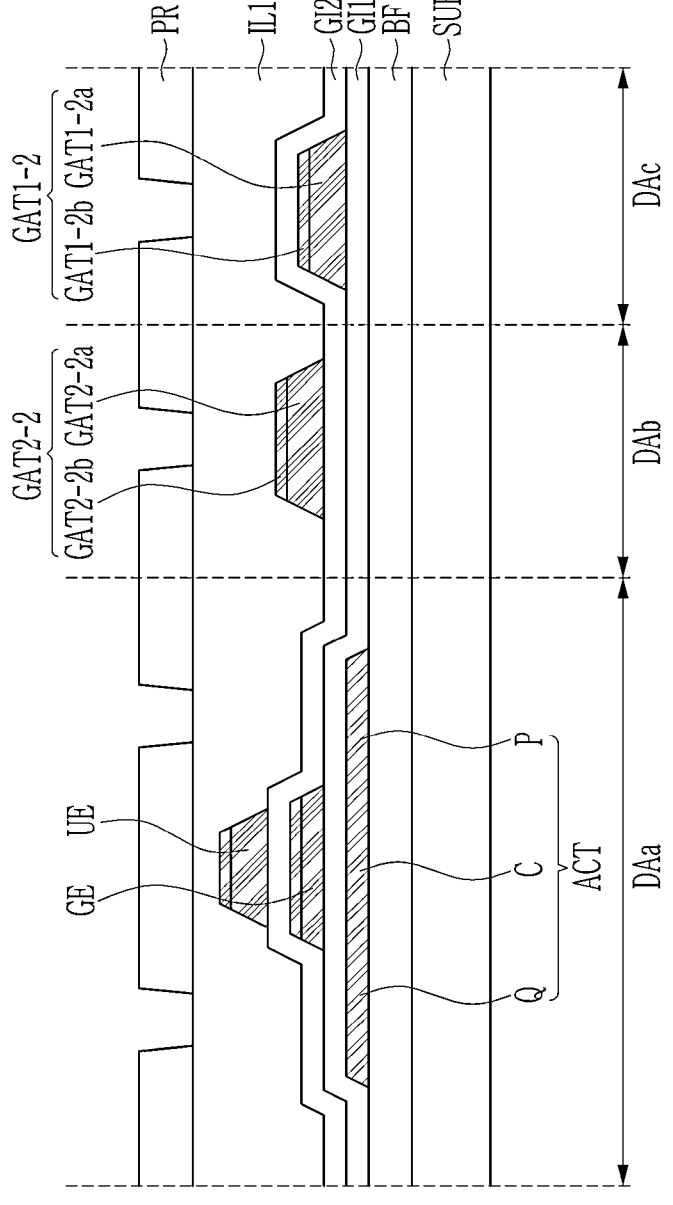

Subsequently, as shown in FIG. 5, the first insulating layer IL1 overlapping the entire surface of the substrate SUB is formed on the second gate conductive layer GAT2. Thereafter, as shown in FIG. 6, a photosensitive pattern PR for forming contact holes is formed on the first insulating layer IL1.

Figure 7:
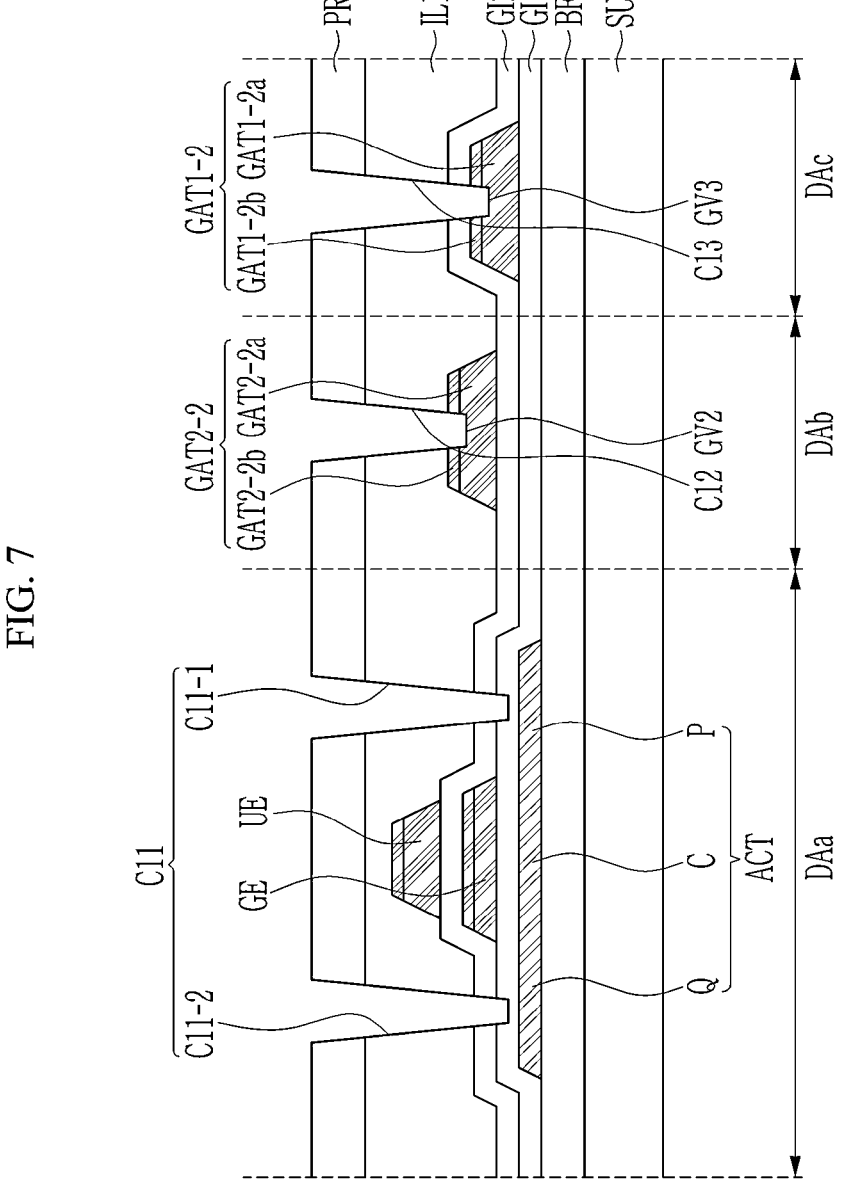

Subsequently, as shown in FIG. 7, the first contact holes C11, the second contact hole C12, and the third contact hole C13 may be formed using the photosensitive pattern PR as a mask.

The first contact holes C11 may include a first-area contact hole C11-1 overlapping the first area P of the semiconductor layer ACT in the first display area DAa, and may include a second-area contact hole C11-2 overlapping the second area Q of the semiconductor layer ACT. The second contact hole C12 may overlap the second gate conductive member GAT2-2 in the second display area DAb. The third contact hole C13 may overlap the first gate conductive member GAT1-2 in the third display area DAc.

The first contact holes C11 may pass through the first insulating layer IL1 and the second gate insulating layer GI2. The first contact holes C11 may extend into the first insulating layer IL1 and may be spaced from the semiconductor layer ACT in a direction perpendicular to the substrate SUB by portions of the first gate insulating layer GI1. The portions of the first gate insulating layer GI1 may overlap the semiconductor layer ACT and may not be etched through.

The second contact hole C12 may pass through the first insulating layer IL1. The second contact hole C12 may pass through the fourth gate conductive sub-member GAT2-2b. The second contact hole C12 may extend into the third gate conductive sub-member GAT2-2a and may be spaced from the second gate insulating layer GI2 in a direction perpendicular to the substrate SUB by a portion of the third gate conductive sub-member GAT2-2a. The third gate conductive sub-member GAT2-2a may include the second groove GV2, which is part of the second contact hole C12.

The third contact hole C13 may pass through the first insulating layer IL1 and the second gate insulating layer GI2. The third contact hole C13 may pass through the second gate conductive sub-member GAT1-2b. The third contact hole C13 may extend into the first gate conductive sub-member GAT1-2a and may be spaced from the first gate insulating layer GI1 in a direction perpendicular to the substrate SUB by a portion of the first gate conductive sub-member GAT1-2a. The first gate conductive sub-member GAT1-2a may include the third groove GV3, which is part of the third contact hole C13.

Figure 8:
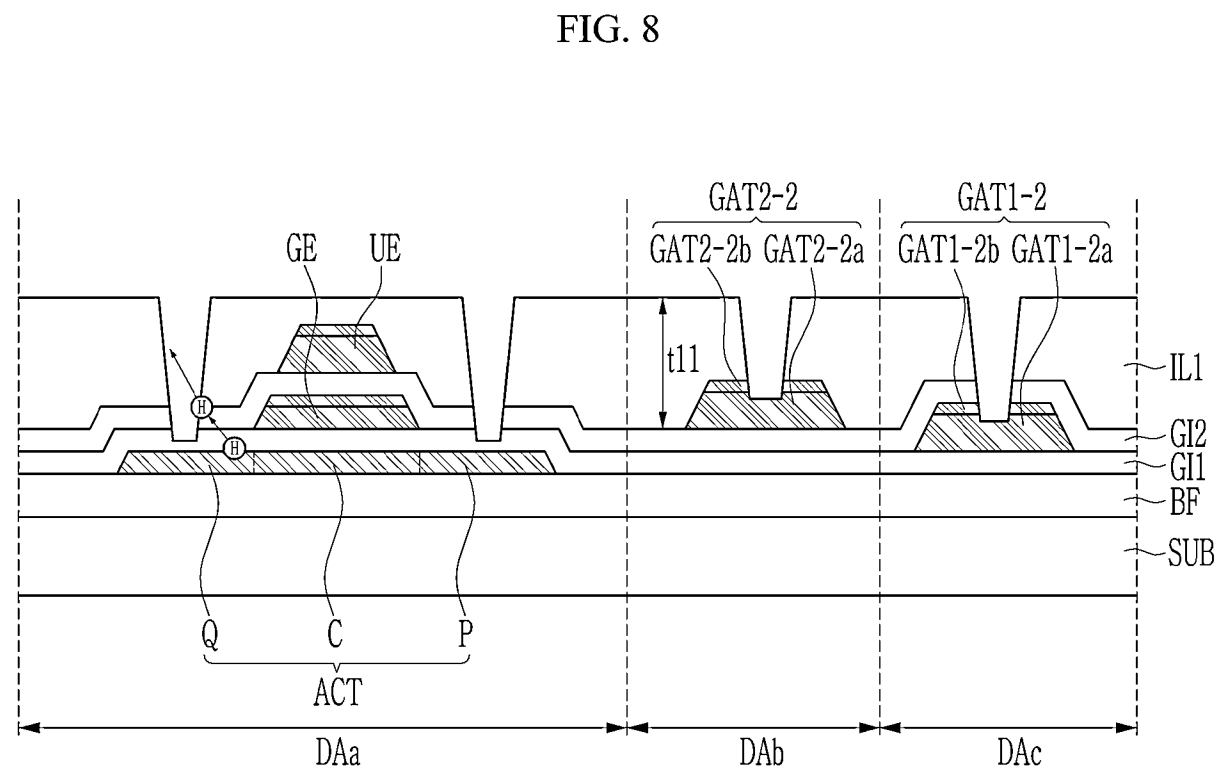

Thereafter, referring to FIG. 8, the photosensitive pattern PR may be removed, and an annealing process may be performed on the semiconductor layer ACT. Dehydrogenation of the semiconductor layer ACT may be performed through the annealing process. Hydrogen leaking from the semiconductor layer ACT may be discharged through portions of the second gate insulating layer GI2 exposed by the first contact hole C11.

Figure 9:
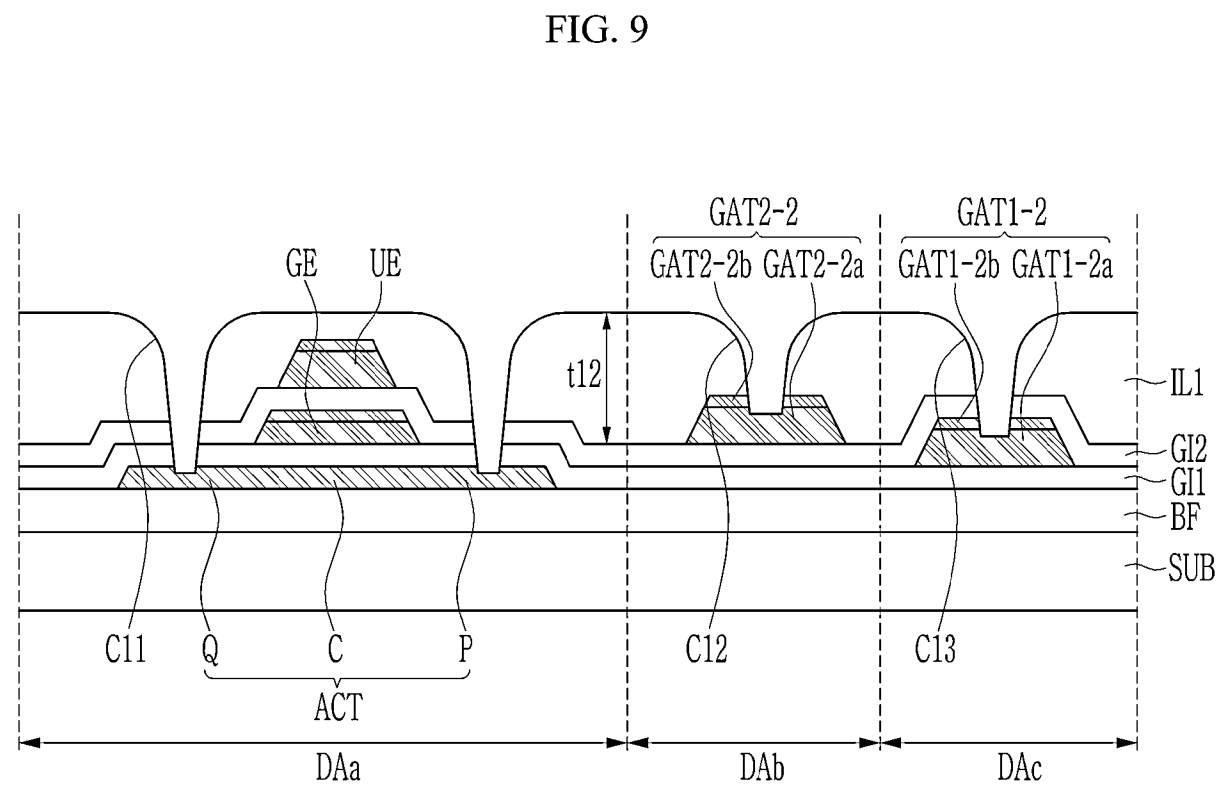

Subsequently, referring to FIG. 9, a dry etching process is performed on the structures formed on the substrate SUB over an entire surface/face of the substrate SUB without a mask. As a result, portions of the first gate insulating layer GI1 exposed by the first contact hole C11 may be etched. The first contact hole C11 may completely penetrate the first gate insulating layer GI1 through the etching process of FIG. 9.

In the etching process over the entire surface of the substrate SUB, portions of the first insulating layer IL1 adjacent to the openings of the contact holes C11, C12, and C13 may also be etched. A cross-section of the etched first insulating layer IL1 in a plane perpendicular to the substrate SUB may have curved profiles that are sidewall sections of the contact holes C11, C12, and C13 near the openings of the contact holes C11, C12, and C13. A thickness t12 of the first insulating layer IL1 may be smaller than a thickness t11 of the first insulating layer IL1 shown in FIG. 8. In the dry etching process over the entire surface of the substrate SUB, the first insulating layer IL1 may be partially etched.

As a result of the dry etching process over the entire surface of the substrate SUB, the upper surface of the first insulating layer IL1 may include fluorine (F), a fluorine-based compound, and/or include CFx, wherein x may be a natural number greater than or equal to 1.

Figure 10:
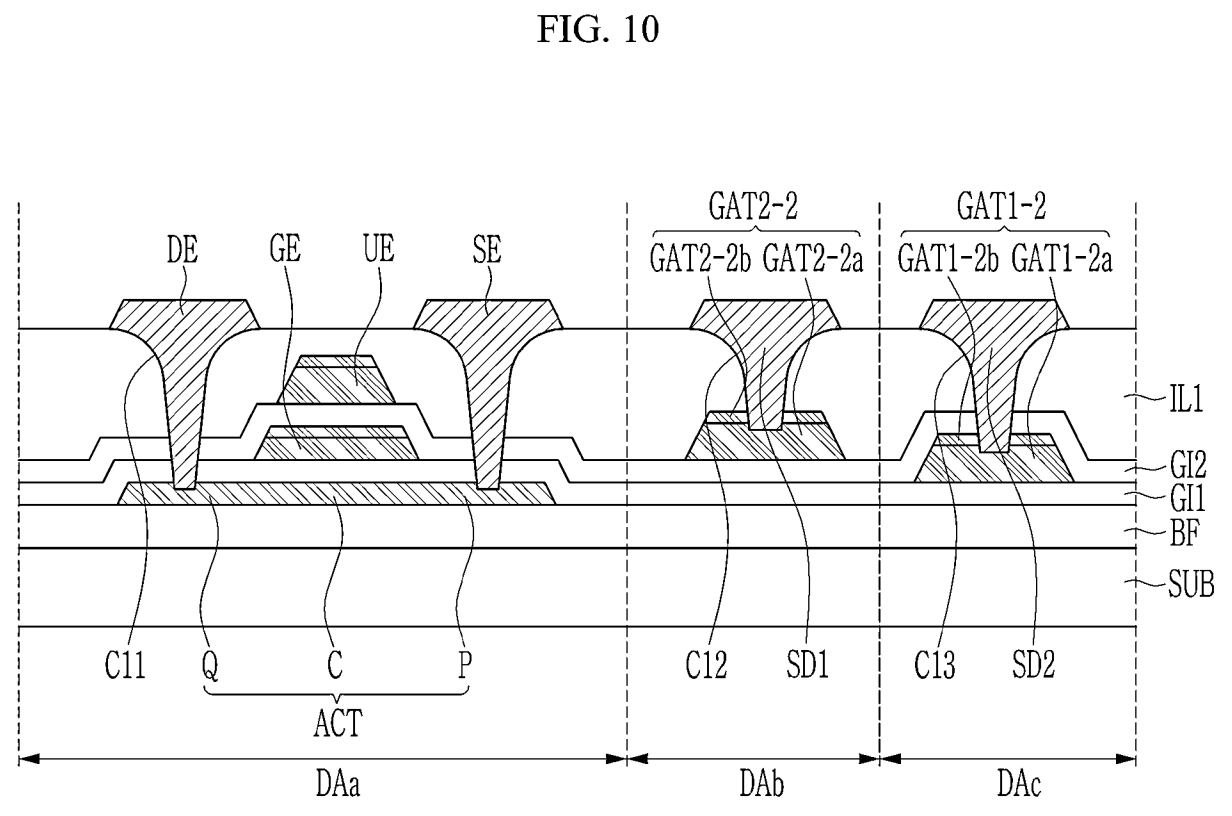

Thereafter, as shown in FIG. 10, a data conductive layer is formed on the first insulating layer IL1. The data conductive layer may include the source electrode SE connected to the first area P, the drain electrode DE connected to the second area Q, the first connection electrode SD1 connected to the second gate conductive member GAT2-2, and the second connection electrode SD2 connected to the first gate conductive member GAT1-2.

Although not shown, the data conductive layer may be formed by forming a conductive material layer on the entire surface of the substrate SUB and subsequently etching the conductive material layer. As a result, fluorine (F), a fluorine-based compound, or CFx on the first insulating layer IL1 may be removed with the etched portions of the conductive material layer. Fluorine (F), a fluorine-based compound, or CFx may remain in/on (curved) portions of the first insulating layer IL1 that directly contact the data conductive layer.

Thereafter, the display device described with reference to FIG. 2 may be provided by sequentially forming the second insulating layer IL2, the first electrode E1, the partition wall IL3, the first functional layer FL1, the light emitting layer EML, the second functional layer FL2, and the second electrode E2 on the data conductive layer.

According embodiments, by maintaining portions of the first gate insulating layer that space the semiconductor layer from contact holes when performing the annealing process on the semiconductor layer, it is possible to prevent an unwanted oxide film from being formed on the semiconductor layer. Since no unwanted oxide film is formed on the semiconductor layer, no process for removing the unwanted oxide film may be required. If a process of removing the unwanted oxide film is performed, the second gate conductive member or the first gate conductive member exposed by the contact hole may be undesirably short-circuited. According to embodiments, when the display device is manufactured, the process of removing an unwanted oxide film is not performed. Advantageously, the reliability of the display device may be satisfactory.

Figure 11:
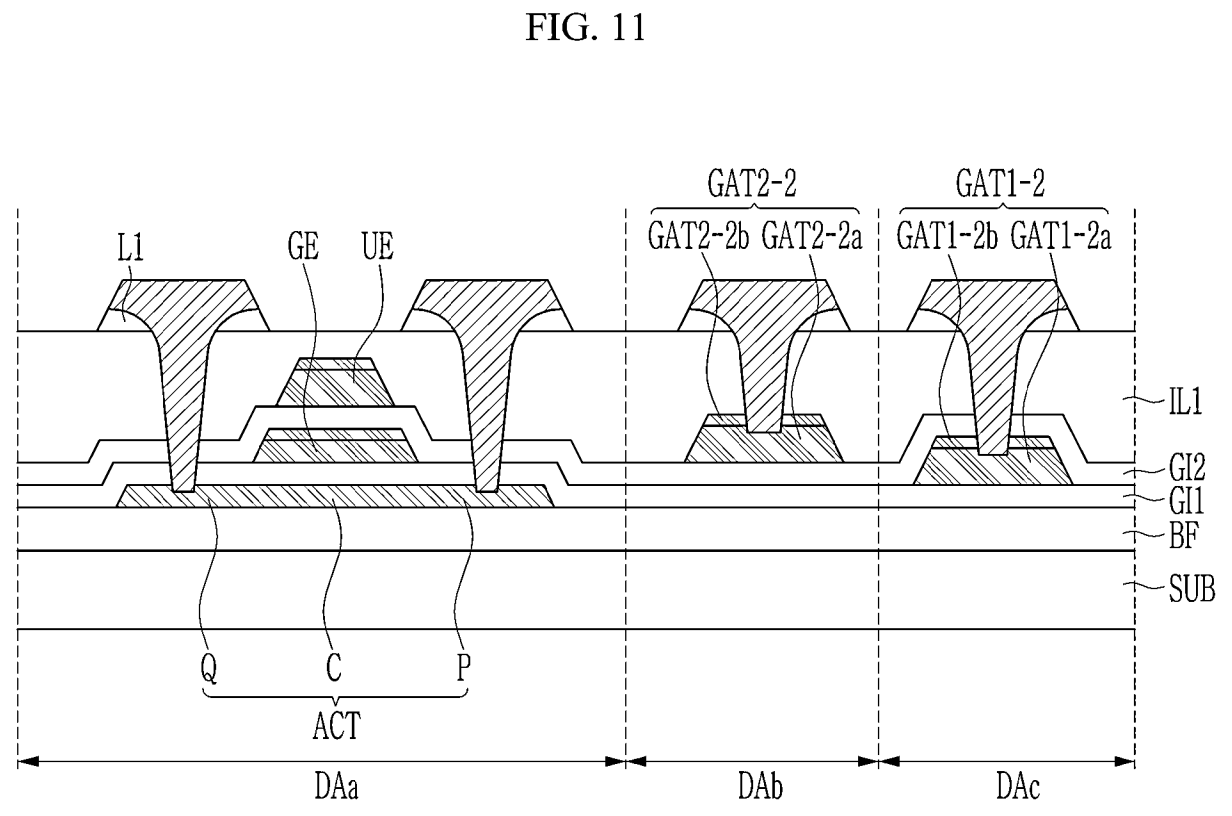

FIG. 11 illustrates a cross-sectional view of a display device according to an embodiment. FIG. 12 to FIG. 16 each illustrate a cross-sectional view of a structure related to a manufacturing process of a display device according an embodiment.

Referring to FIG. 11, the display device may include features described with reference to FIG. 2. The display device may further include an auxiliary layer L1 positioned between the first insulating layer IL1 and the data conductive layer. The auxiliary layer L1 may include amorphous silicon.

The auxiliary layer L1 may be disposed between the upper surface of the first insulating layer IL1 and the lower surface of the data conductive layer facing the upper surface of the first insulating layer IL1. An edge/face of the auxiliary layer L1 may be aligned and/or coplanar with an edge/face of the data conductive layer.

A manufacturing method of the display device of FIG. 11 is described with reference to FIG. 12 and FIG. 16 and may include features described with reference to one or more of FIG. 4 to FIG. 10.

Figure 12:
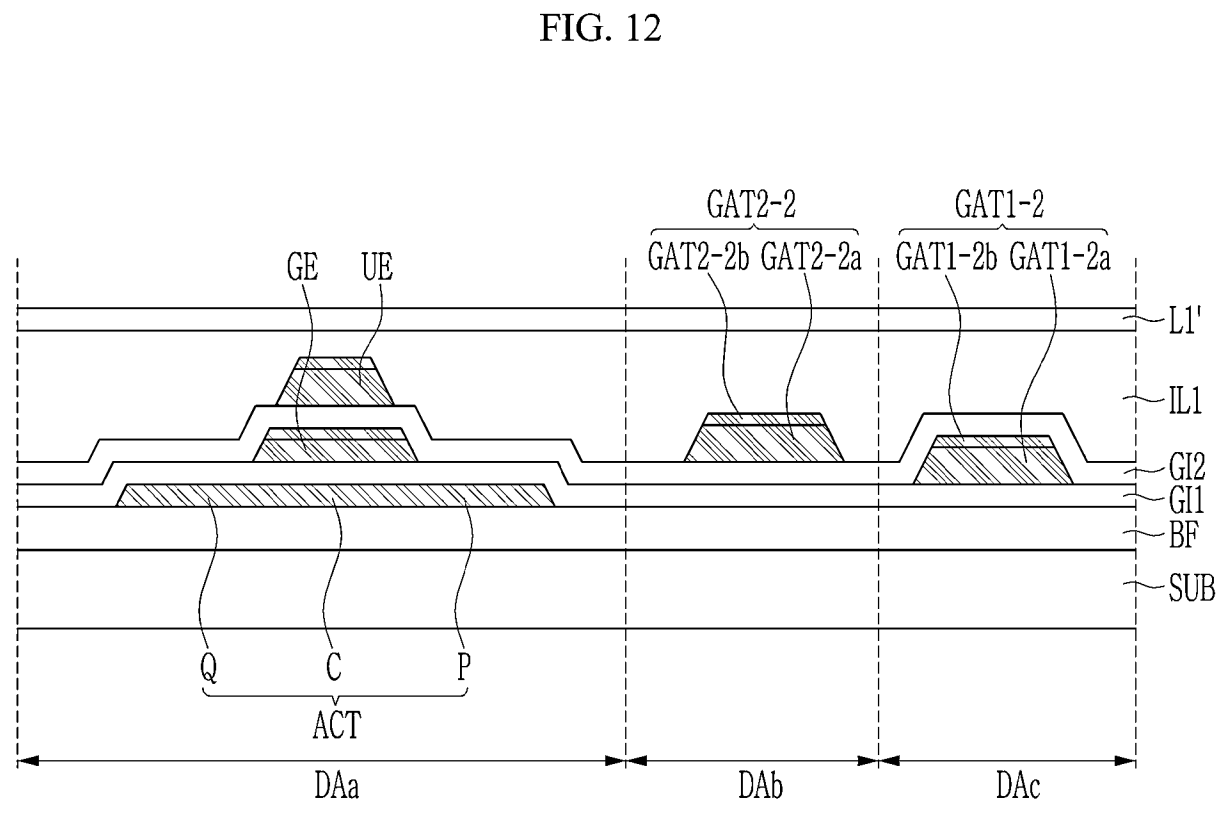

Referring to FIG. 12, an auxiliary material layer L1' overlapping an entire surface/face of the substrate SUB is formed on the first insulating layer IL1. The auxiliary material layer L1' may include amorphous silicon.

Figure 13:
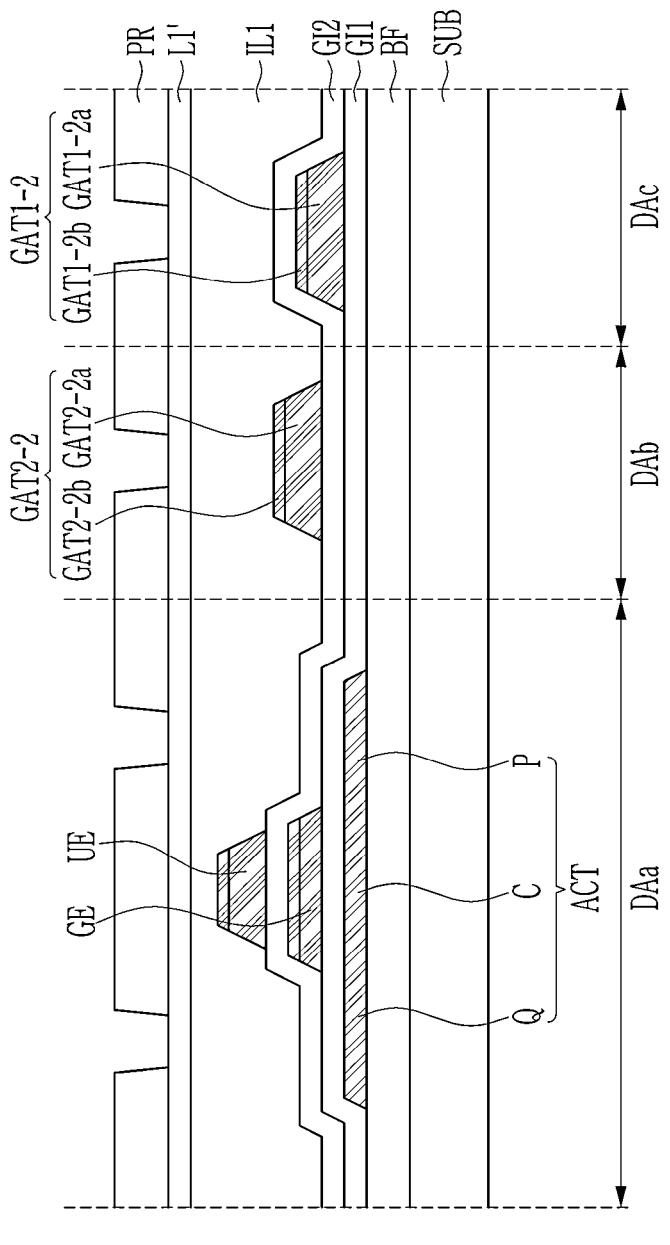
Figure 14:
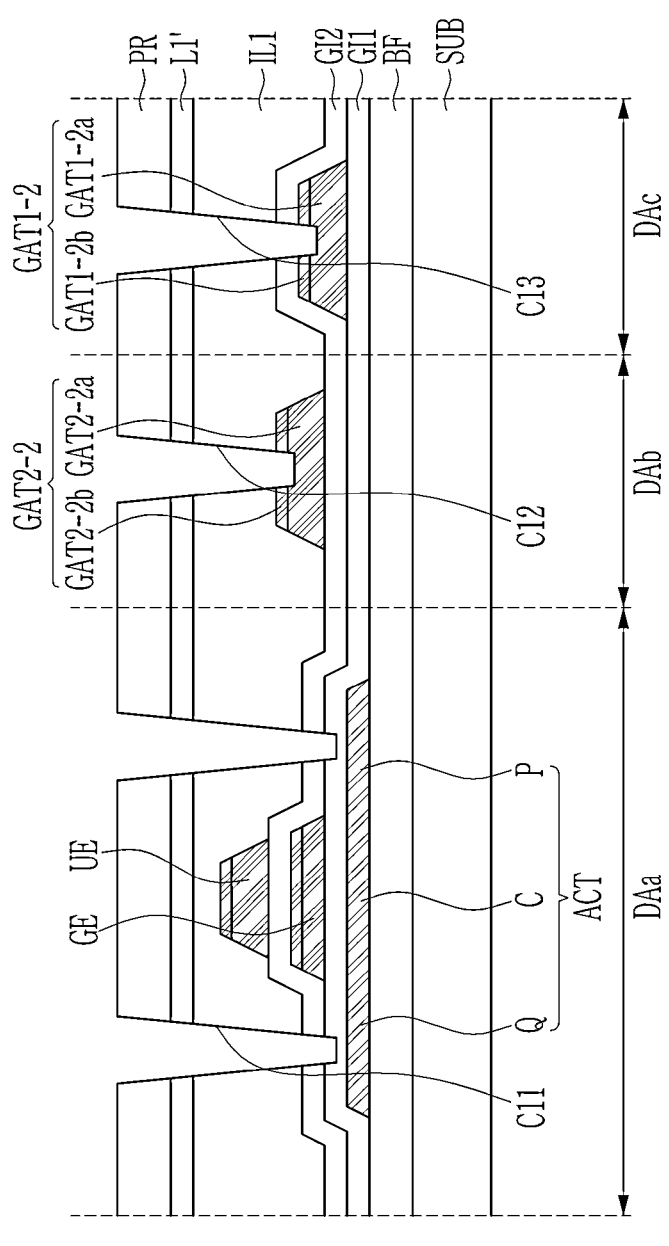
Figure 15:
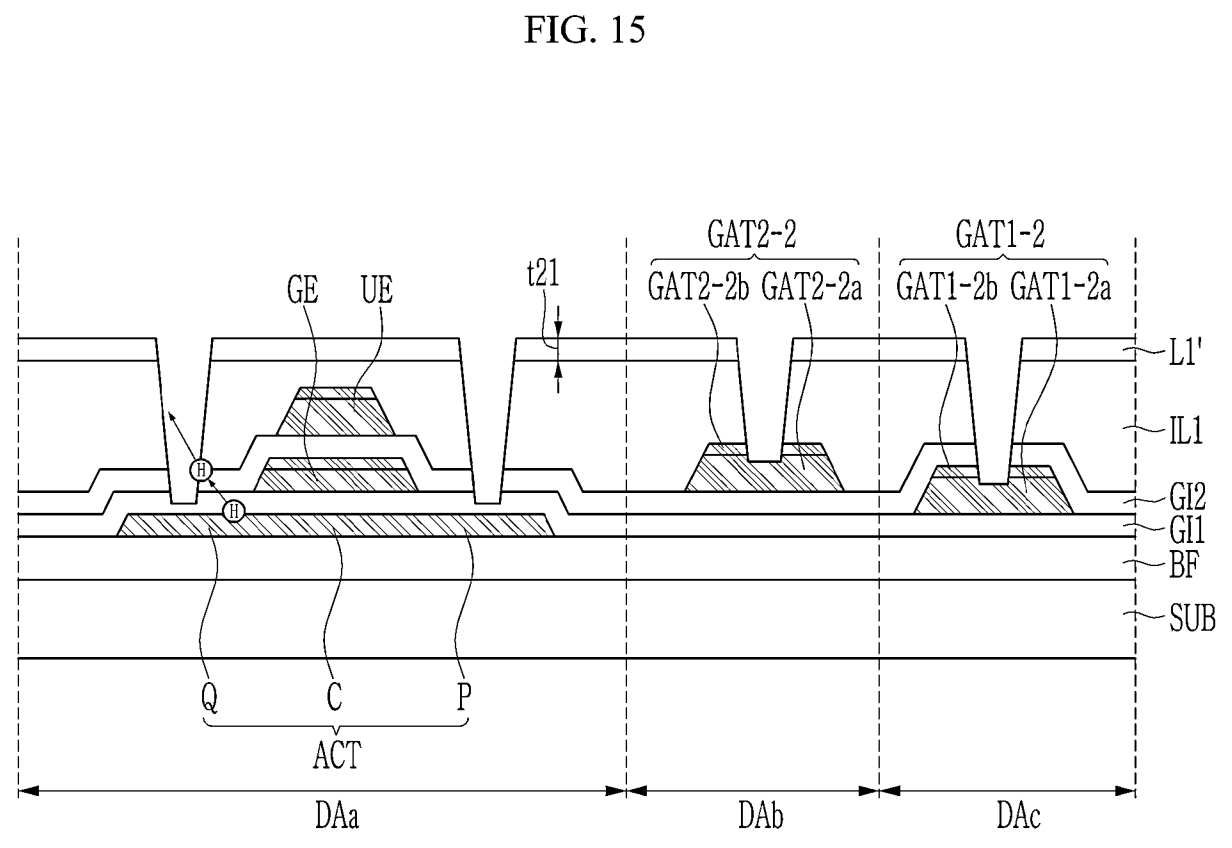

Thereafter, as shown in FIG. 13, a photosensitive pattern PR for forming contact holes is formed in the auxiliary material layer L1'. Subsequently, as shown in FIG. 14, the first contact holes C11, the second contact hole C12, and the third contact hole C13 may be formed. Subsequently, referring to FIG. 15, the photosensitive pattern PR is removed, and an annealing process is performed on the semiconductor layer ACT.

Subsequently, referring to FIG. 16, a dry etching process is performed on the structures formed on the substrate SUB over an entire surface/face of the substrate SUB. The auxiliary material layer L1' may be partially etched. A thickness t22 of the auxiliary layer L1 illustrated in FIG. 16 may be smaller than a thickness t21 of the auxiliary layer L1 illustrated in FIG. 15. The auxiliary material layer L1' may be completely etched.

Thereafter, the data conductive material layer is formed on the auxiliary material layer L1' and etched to form the data conductive layer and the auxiliary layer L1 as shown in FIG. 11. In the process of forming the data conductive layer, the auxiliary material layer L1' that does not overlap the data conductive layer may be removed. The auxiliary layer L1 may remain only between the first insulating layer IL1 and the data conductive layer, as shown in FIG. 11.

Figure 16:
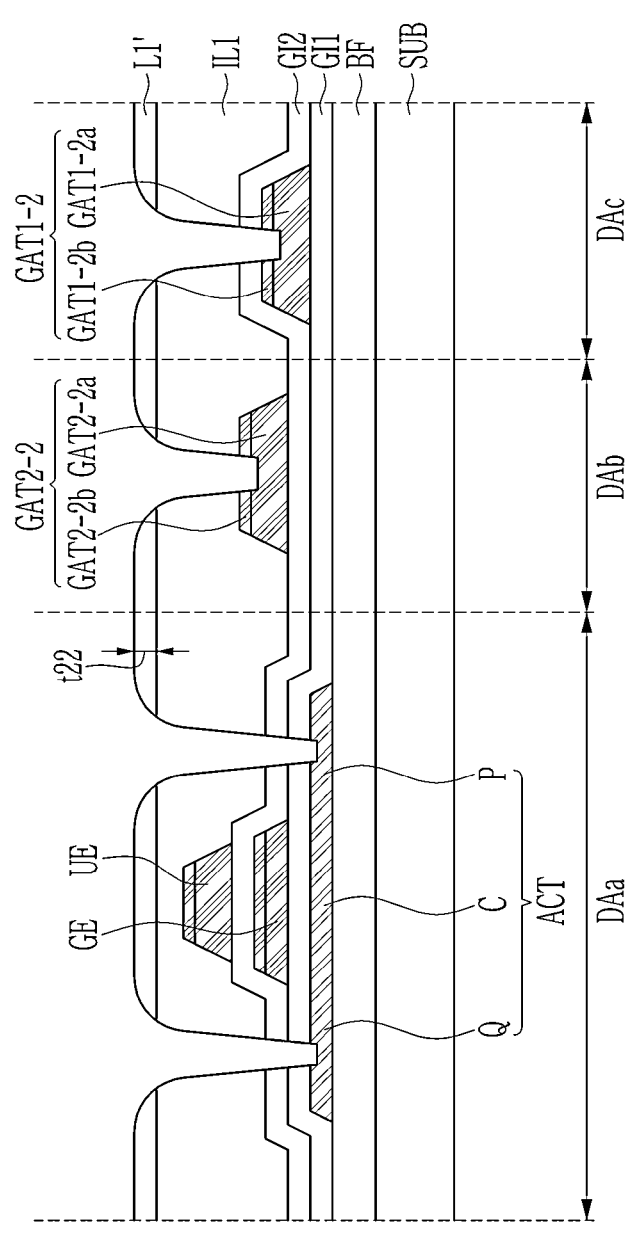

When the auxiliary material layer L1' is completely removed in the etching process of FIG. 16, the display device may have the structure shown in FIG. 2.

According to embodiments, in the annealing process of the semiconductor layer, the semiconductor layer may be covered by the first gate insulating layer. Oxidation of the semiconductor layer does not occur when the annealing process is performed. If the semiconductor layer is not covered, an unwanted oxide film may be formed on the upper surface of the semiconductor layer as a result of the annealing process. In the etching process for removing the unwanted oxide film, the first gate conductive member and/or the second gate conductive member may be undesirably short circuited. According to embodiments, the above-mentioned short circuit may be prevented. Advantageously, the reliability of display devices may be satisfactory.

Figure 17:
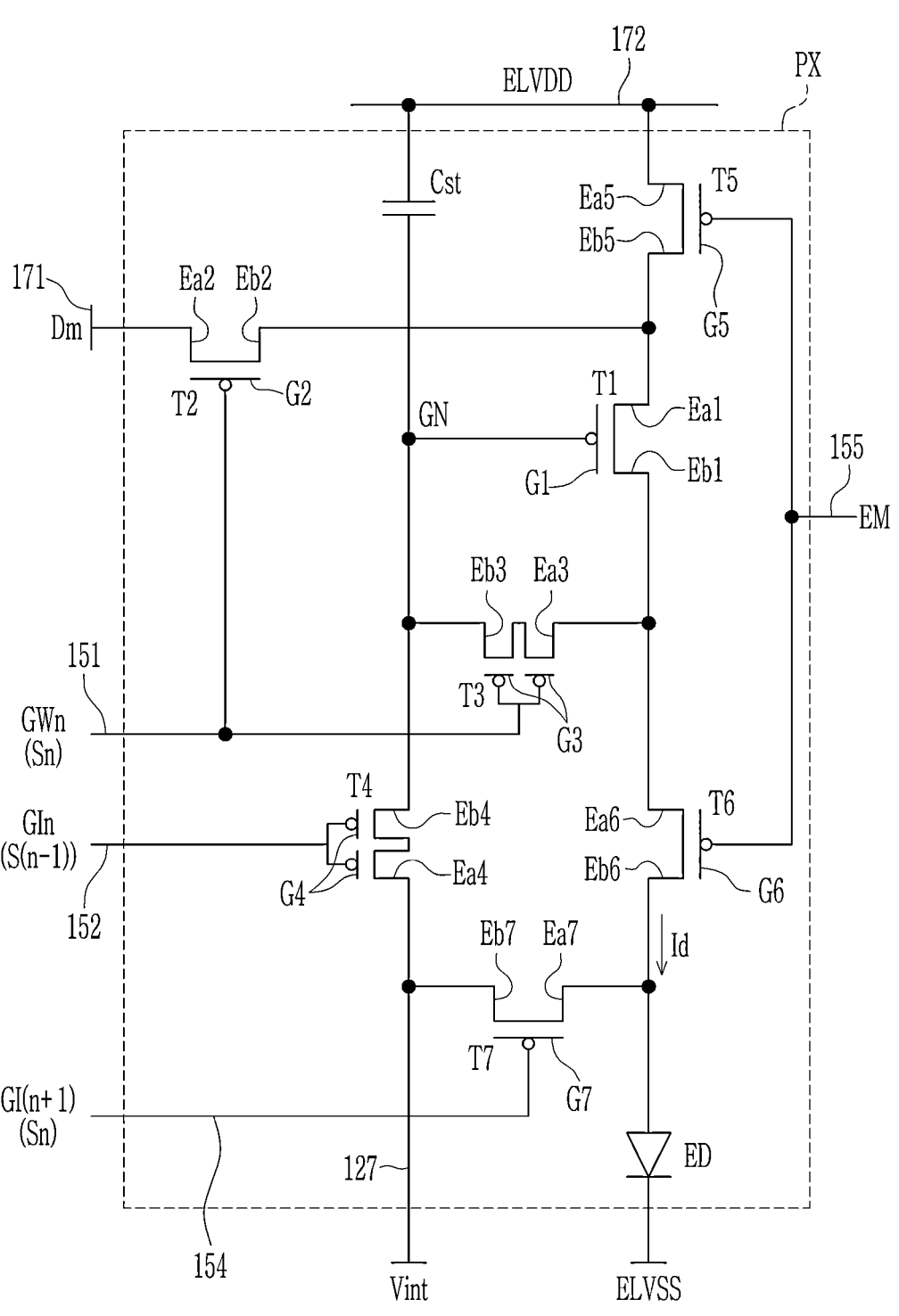
FIG. 17 illustrates a circuit diagram of one pixel of a display device according to an embodiment.
Figure 18:
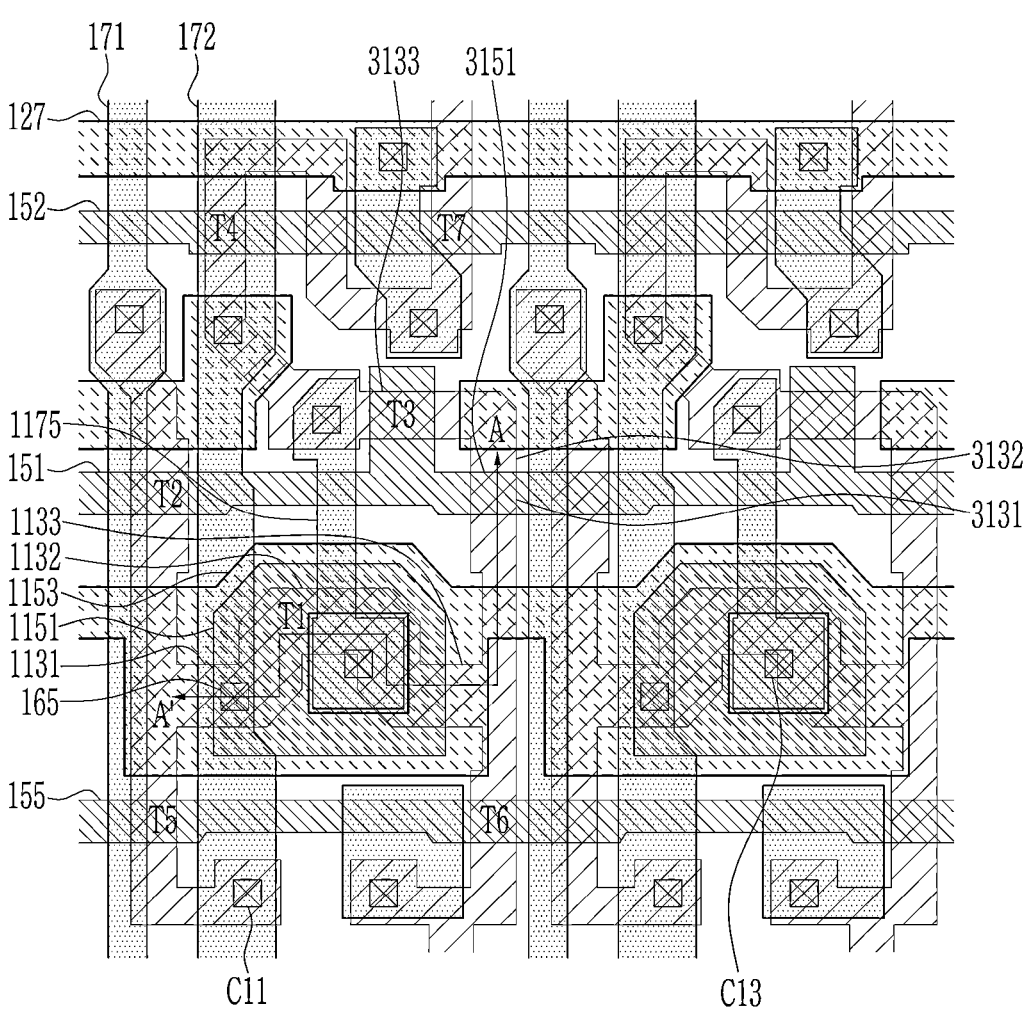
FIG. 18, FIG. 20, FIG. 22, FIG. 24, and FIG. 26 each illustrate a top plan view of a partial configuration of a display device according to an embodiment.
Figure 19:
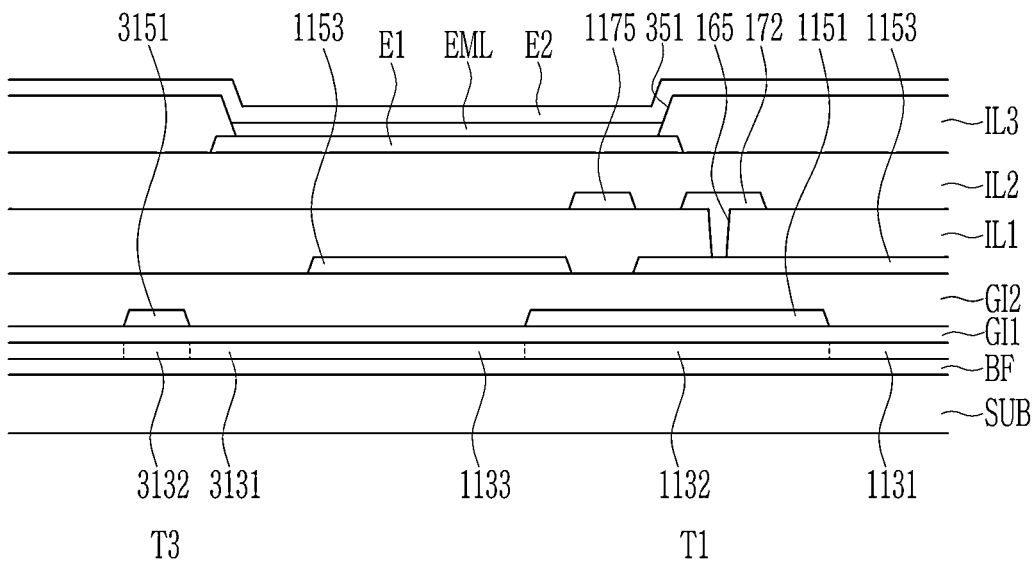
FIG. 19, FIG. 21, FIG. 23, FIG. 25, and FIG. 27 each illustrate a cross-sectional view of a partial configuration of a display device according to an embodiment.
Figure 20:
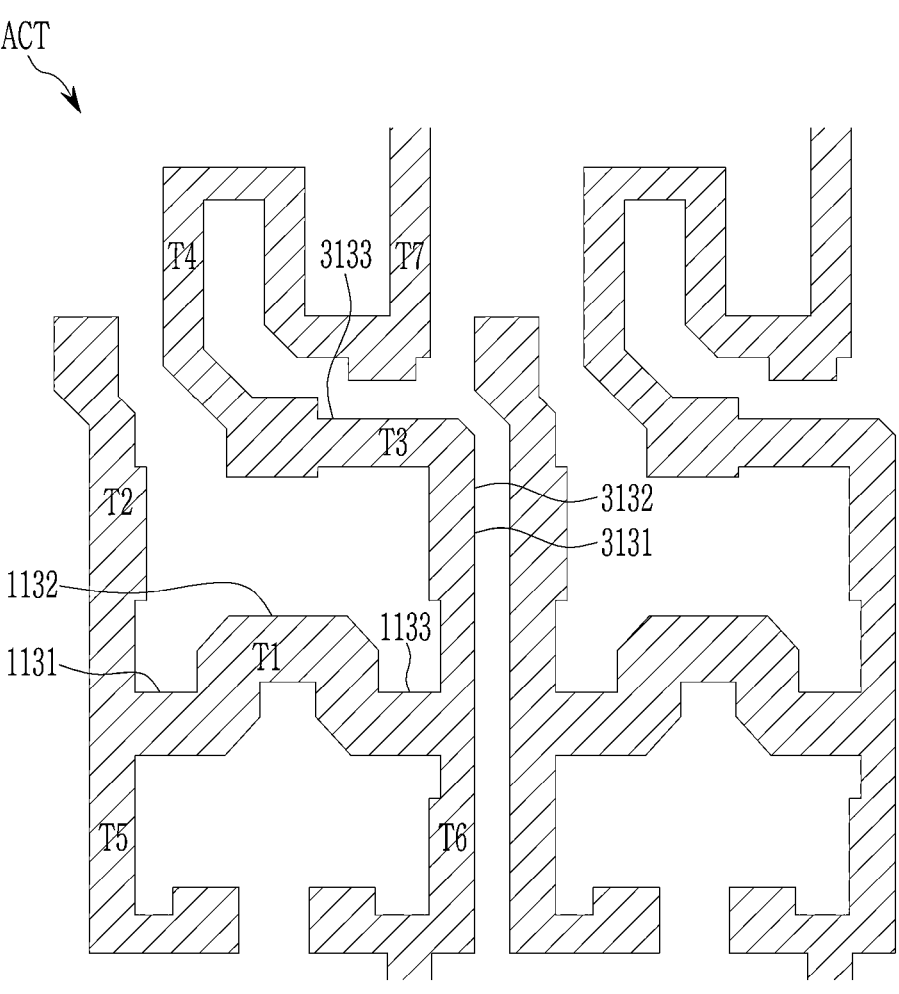
Figure 21:
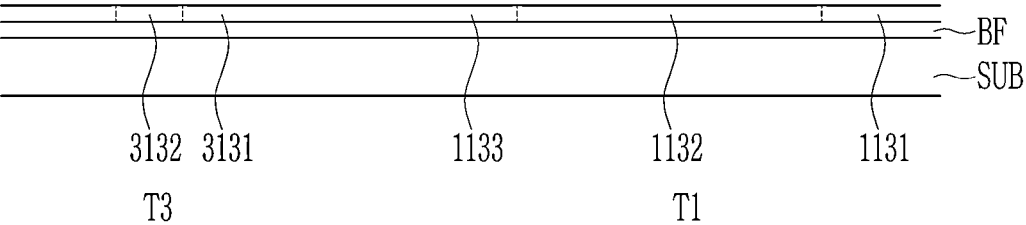

FIG. 17 illustrates a circuit diagram of one pixel PX of a display device according to an embodiment.

Referring to FIG. 17, the display device includes the pixels PX and signal lines 127, 151, 152, 154, 155, 171, and 172. The pixel PX may include transistors T1, T2, T3, T4, T5, T6, and T7 connected to the signal lines 127, 151, 152, 154, 155, 171, and 172, a capacitor Cst, and at least one light emitting diode ED.

The signal lines 127, 151, 152, 154, 155, 171, and 172 may include an initialization voltage line 127, scan lines 151, 152, and 154, an emission control line 155, a data line 171, and a driving voltage line 172.

The initialization voltage line 127 may transmit an initialization voltage Vint. The scan lines 151, 152, and 154 may respectively transmit scan signals GWn, GIn, and GI(n+1). The scan signals GWn, GIn, and GI(n+1) may each include a gate-on voltage and a gate-off voltage that may turn-on and turn-off the transistors T2, T3, T4, and T7 included in the pixel PX.

The scan lines 151, 152, and 154 connected to one pixel PX may include a first scan line 151 for transmitting the scan signal GWn, a second scan line 152 for transmitting the scan signal GIn having a gate-on voltage at different timing from that of the first scan line 151, and a third scan line 154 for transmitting a scan signal GI(n+1). The second scan line 152 may transmit a gate-on voltage at earlier timing than the first scan line 151. For example, when the scan signal GWn is an n-th scan signal Sn (wherein n is a natural number of 1 or more) among scan signals applied during one frame, the scan signal GIn may be a previous scan signal such as an (n−1)-th scan signal, and the scan signal GI(n+1) may be an n-th scan signal Sn. The scan signal GI(n+1) may be a different scan signal from the n-th scan signal Sn.

The emission control line 155 may transmit an emission control signal EM for controlling light emission of the light emitting diode ED included in the pixel PX. The emission control signal EM may include a gate-on voltage and a gate-off voltage, and may have a different waveform from that of a scan signal transmitted by the scan lines 151, 152, and 154.

The data line 171 may transmit a data signal Dm, and the driving voltage line 172 may transmit a driving voltage ELVDD. The data signal Dm may have a different voltage level depending on an image signal inputted to the display device, and the driving voltage ELVDD may have a substantially constant level.

Although not shown, the display device may further include a driver that transmits signals to the signal lines 127, 151, 152, 154, 155, 171, and 172.

The plurality of transistors T1, T2, T3, T4, T5, T6, and T7 may include a driving transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal GIn to the fourth transistor T4, the third scan line 154 may transmit the scan signal GI(n+1) to the seventh transistor T7, and the emission control line 155 may transmit the emission control signal EM to the fifth transistor T5 and the sixth transistor T6.

A gate electrode G1 of the driving transistor T1 is connected to one end/electrode of the capacitor Cst through a driving gate node (GN), a first electrode Ea1 of the driving transistor T1 is connected to the driving voltage line 172 via the fifth transistor T5, and a second electrode Eb1 of the driving transistor T1 is connected to an anode of the light emitting diode ED via the sixth transistor T6. The driving transistor T1 may receive the data signal Dm transmitted by the data line 171 according to a switching operation of the second transistor T2 to supply a driving current Id to the light emitting diode ED.

A gate electrode G2 of the second transistor T2 is connected to the first scan line 151, a first electrode Ea2 of the second transistor T2 is connected to the data line 171, and a second electrode Eb2 of the second transistor T2 is connected to the first electrode Ea1 of the driving transistor T1 and is connected to the driving voltage line 172 via the fifth transistor T5. The second transistor T2 may be turned on according to the scan signal GWn transmitted through the first scan line 151 to transmit the data signal Dm transmitted from the data line 171 to the first electrode Ea1 of the driving transistor T1.

A gate electrode G3 of the third transistor T3 is connected to the first scan line 151, and a first electrode Ea3 of the third transistor T3 is connected to the second electrode Eb1 of the driving transistor T1 and is connected to the anode of the light emitting diode ED via the sixth transistor T6. A second electrode Eb3 of the third transistor T3 is connected to a second electrode Eb4 of the fourth transistor T4, one end of the capacitor Cst, and the gate electrode G1 of the driving transistor T1. The third transistor T3 may be turned on according to the scan signal GWn transmitted through the driving scan line 151 to connect the gate electrode G1 and the second electrode Eb1 of the driving transistor T1 to each other to diode-connect the driving transistor T1.

A gate electrode G4 of the fourth transistor T4 is connected to the second scan line 152; a first electrode Ea4 of the fourth transistor T4 is connected to a terminal of the initialization voltage Vint; and a second electrode Eb4 of the fourth transistor T4 is connected to one end of the capacitor Cst, the gate electrode G1 of the driving transistor T1, and the second electrode Eb3 of the third transistor T3. The fourth transistor T4 may be turned on according to the scan signal GIn received through the second scan line 152 to transmit the initialization voltage Vint to the gate electrode G1 of the driving transistor T1 to perform an initializing operation for initializing a voltage of the gate electrode G1 of the driving transistor T1.

A gate electrode G5 of the fifth transistor T5 is connected to the emission control line 155, a first electrode Ea5 of the fifth transistor T5 is connected to the driving voltage line 172, and a second electrode Eb5 of fifth transistor T5 is connected to the first electrode Ea1 of the driving transistor T1 and the second electrode Eb2 of second transistor T2.

A gate electrode G6 of the sixth transistor T6 is connected to the emission control line 155, a first electrode Ea6 of the sixth transistor T6 is connected to the second electrode Eb1 of the driving transistor T1 and the first electrode Ea3 of the third transistor T3, and a second electrode Eb6 of the sixth transistor T6 is electrically connected to the anode of the light emitting diode ED. The fifth transistor T5 and the sixth transistor T6 may be simultaneously turned on according to the light emission control signal EM received through the emission control line 155, and through this, the driving voltage ELVDD may be compensated through the diode-connected driving transistor T1 to be transmitted to the light emitting diode ED.

A gate electrode G7 of the seventh transistor T7 is connected to the third scan line 154, a first electrode Ea7 of the seventh transistor T7 is connected to the second electrode Eb6 of the sixth transistor T6 and the anode of the light emitting diode ED, and a second electrode Eb7 of the seventh transistor T7 is connected to the terminal of the initialization voltage Vint and the first electrode Ea4 of the fourth transistor T4.

The transistors T1, T2, T3, T4, T5, T6, and T7 may be P-type channel transistors such as a PMOS. At least one of the transistors T1, T2, T3, T4, T5, T6, and T7 may be an N-type channel transistor. Both a P-type channel transistor and an N-type channel transistor may be included in the transistors T1, T2, T3, T4, T5, T6, and T7.

One end/electrode of the capacitor Cst is connected to the gate electrode G1 of the driving transistor T1, and the other end/electrode of the capacitor Cst is connected the driving voltage line 172. The cathode of the light emitting diode ED may be connected to a common voltage ELVSS terminal to receive the common voltage ELVSS.

Although the structure in which one pixel includes seven transistors and one capacitor is illustrated, the number of transistors and capacitors included in one pixel PX of the display device and the connection relations may be configured according to particular embodiments.

FIG. 18, FIG. 20, FIG. 22, FIG. 24, and FIG. 26 each illustrate a top plan view of a partial configuration of a display device according to an embodiment. FIG. 19, FIG. 21, FIG. 23, FIG. 25, and FIG. 27 each illustrate a cross-sectional view of a partial configuration of a display device according to an embodiment.

Referring to FIG. 18, FIG. 19, FIG. 20, and FIG. 21, the semiconductor layer ACT may be disposed on the substrate SUB, may include a channel 1132, a first area 1131, and a second region 1133 of the first transistor T1, and may include a channel 3132, a first area 3131, and a second region 3133 of the third transistor T3. The semiconductor layer ACT may further include a channel, a first area, and a second area of each of the second transistor T2, the fourth transistor T4, the fifth transistor T5, the sixth transistor T6, and the seventh transistor T7.

The channel 1132, the first area 1131, and the second area 1133 of the first transistor T1, and the channel 3132, the first area 3131, and the second area 3133 of the third transistor T3 may be connected to each other and may be integrally formed. The second area 1133 of the first transistor T1 may extend from the first area 3131 of the third transistor T3.

A channel 1132 of the first transistor T1 may have a curved shape in a plan view. The shape of the channel 1132 of the first transistor T1 may be configured according to particular embodiments. The channel 1132 of the first transistor T1 may be bent in a different shape or may be formed in a rod shape. The first area 1131 and the second area 1133 of the first transistor T1 may be positioned at opposite sides of the channel 1132 of the first transistor T1.

The second area 1133 of the first transistor T1 may be connected to the first area of the sixth transistor T6 and may be connected to the first area 3131 of the third transistor T3.

The first area 3131 and the second area 3133 of the third transistor T3 may be positioned at different sides of the channel 3132 of the third transistor T3. One end of the third transistor T3 may be connected to the second area 1133 of the first transistor T1, and the other end of the third transistor T3 may be connected to the second area of the fourth transistor T4.

The buffer layer BF may be positioned between the substrate SUB and the semiconductor layer ACT.

Figure 22:
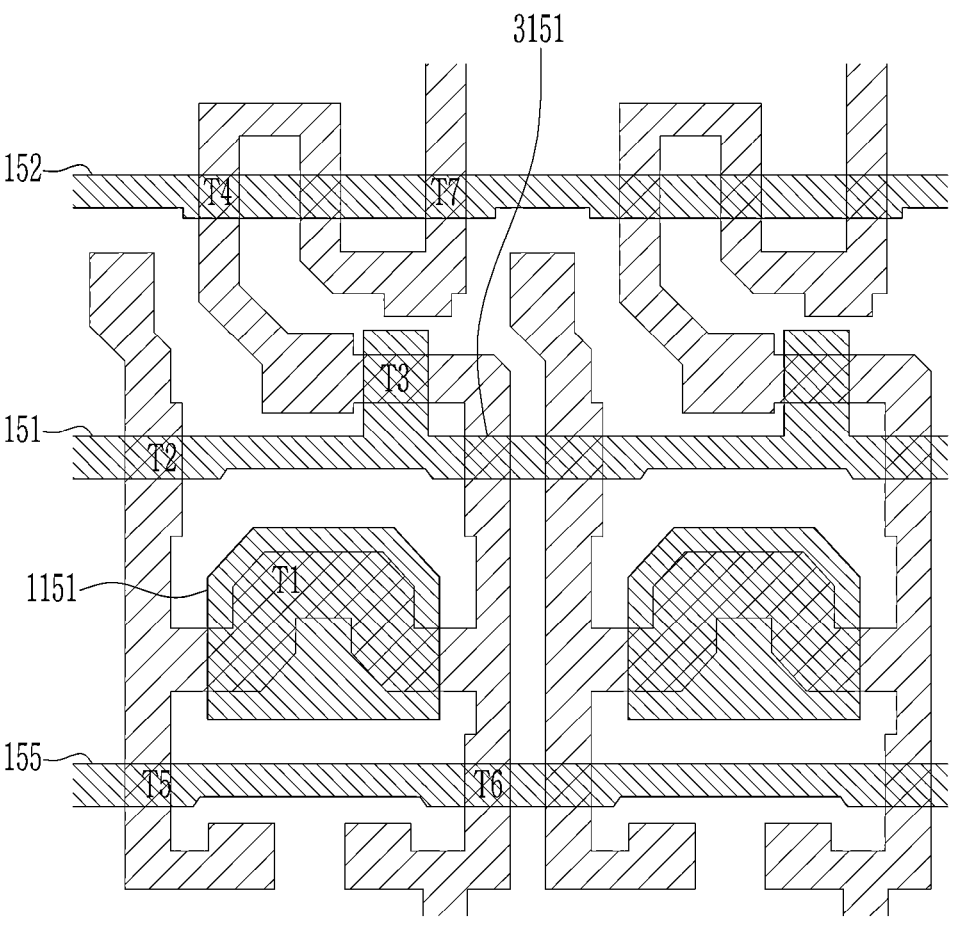
Figure 23:
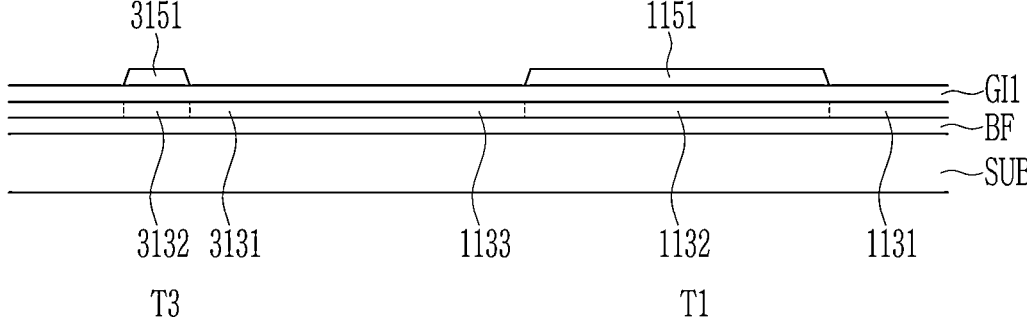

FIG. 22 and FIG. 23 illustrate the semiconductor layer and the first gate conductive layer. The first gate insulating layer GI1 may be positioned on the substrate SUB and the semiconductor layer ACT. At least a portion of the first gate insulating layer GI1 may directly contact the buffer layer BF.

The first gate conductive layer may be positioned on the first gate insulating layer GI1. The first gate conductive layer may include the first scan line 151, the second scan line 152, and the emission control line 155. The first scan line 151, the second scan line 152, and the emission control line 155 may substantially extend in a pixel row direction. Each of the first scan line 151, the second scan line 152, and the emission control line 155 may be connected to a plurality of pixels. For example, a plurality of pixels positioned in the same row may be connected to the same first scan line 151, second scan line 152, and emission control line 155. The first scan line 151 may be connected to the gate electrode of the second transistor T2 and the gate electrode 3151 of the third transistor T3. The first scan line 151 may be formed integrally with the gate electrode of the second transistor T2 and the gate electrode of the third transistor T3. The second scan line 152 may be connected to the gate electrode of the fourth transistor T4. The second scan line 152 may be formed integrally with the gate electrode of the fourth transistor T4. The second scan line 152 may be connected to the gate electrode of the seventh transistor T7 positioned at the pixel of the previous stage. The third scan line 154 connected to the seventh transistor T7 may be formed as the second scan line 152 at the next stage. The emission control line 155 may be connected to the gate electrode of the fifth transistor T5 and the gate electrode of the sixth transistor T6. The emission control line 155 may be formed integrally with the gate electrode of the fifth transistor T5 and the gate electrode of the sixth transistor T6.

The first gate conductive layer may further include the gate electrode 1151 of the first transistor T1. The gate electrode 1151 of the first transistor T1 may overlap the channel 1132 of the first transistor T1.

Figure 24:
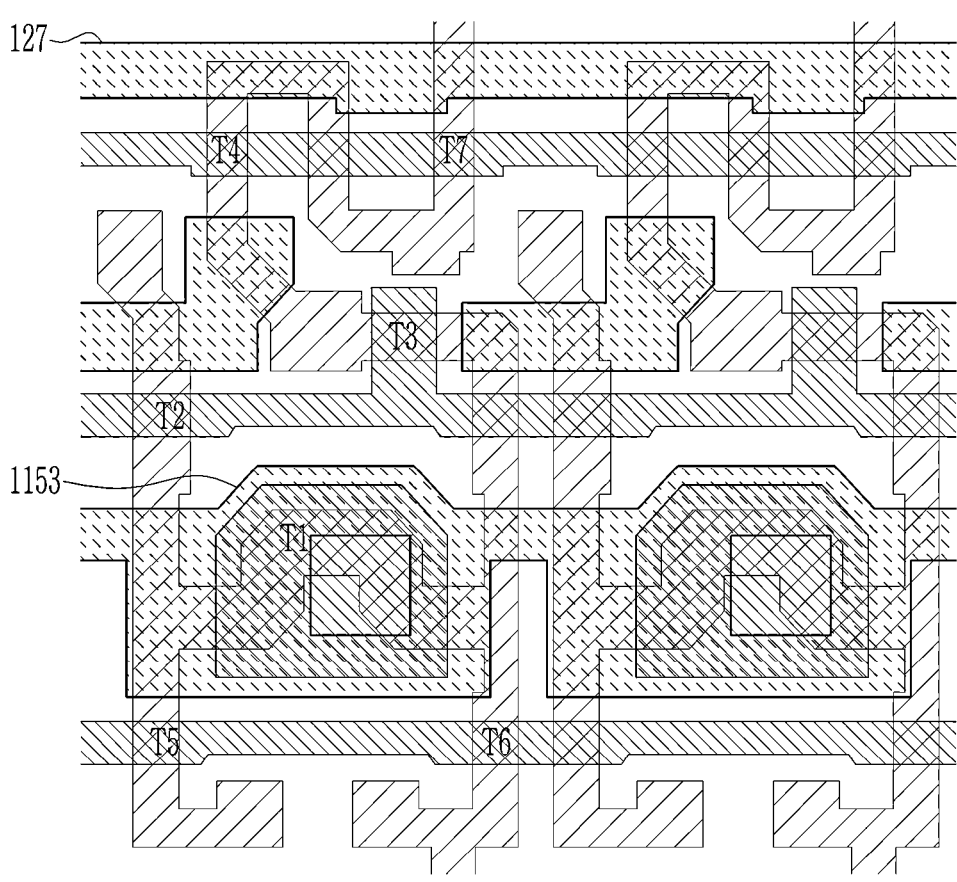
Figure 25:
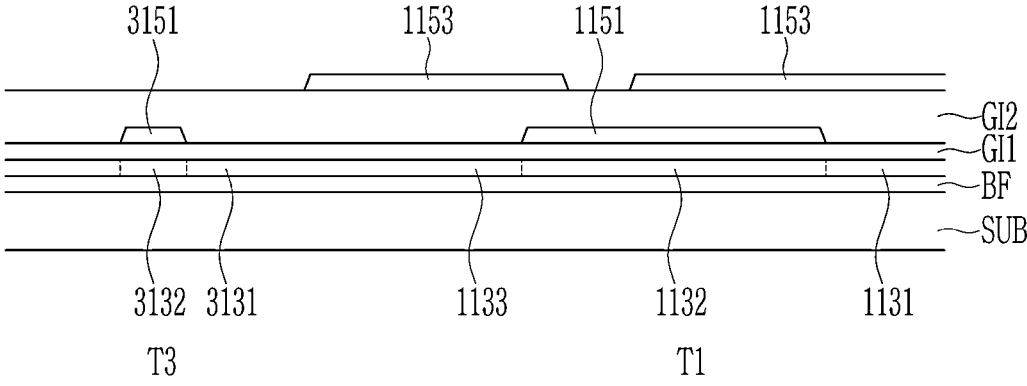

FIG. 24 and FIG. 25 illustrate the semiconductor layer, the first gate conductive layer, and the second gate conductive layer. The second gate insulating layer GI2 may be positioned on the first gate conductive layer and the first gate insulating layer GI1. At least a portion of the second gate insulating layer GI2 may be positioned directly on the first gate insulating layer GI1.

The second gate conductive layer may be positioned on the second gate insulating layer GI2. The second gate conductive layer may include the storage electrode 1153. The storage electrode 1153 may overlap the first gate electrode 1151 to form the capacitor Cst.

The second gate conductive layer may further include the initialization voltage line 127. The initialization voltage line 127 may substantially extend in the pixel row direction. The initialization voltage line 127 may be connected to a plurality of pixels. For example, a plurality of pixels positioned in the same row may be connected to the same initialization voltage line 127.

Figure 26:
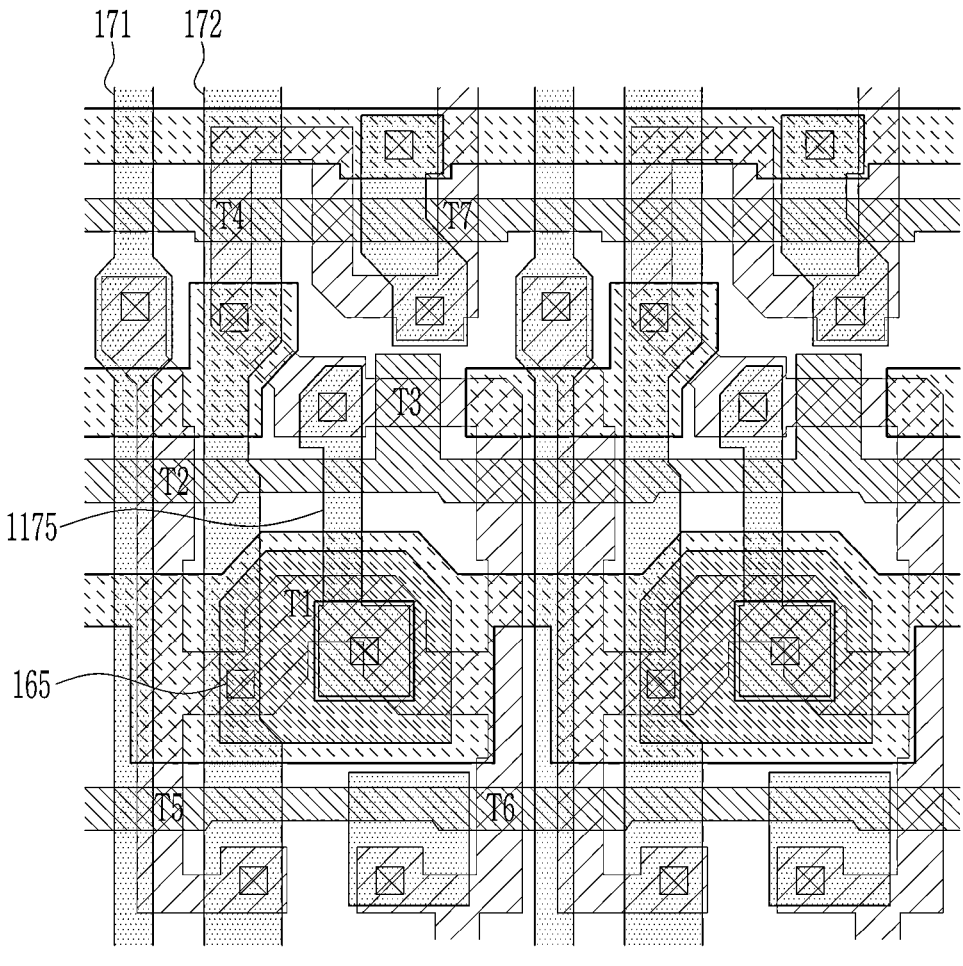
Figure 27:
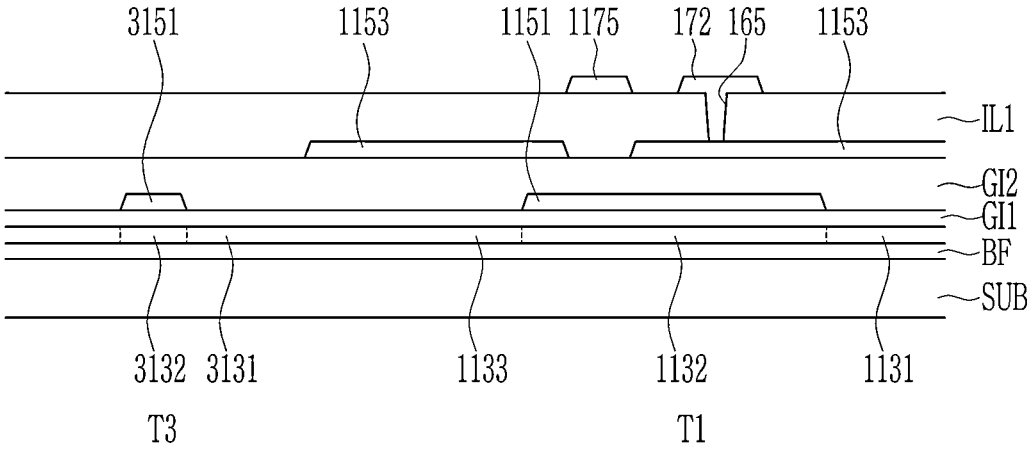

FIG. 26 and FIG. 27 illustrate the semiconductor layer, the first gate conductive layer, the second gate conductive layer, and the data semiconductor layer. The first insulating layer IL1 may be positioned on the second gate conductive layer and the second gate insulating layer GI2. The data conductive layer including the data line 171, the driving voltage line 172, and the connection electrode 1175 may be positioned on the first insulating layer IL1. The data conductive layer may include the data line 171, the driving voltage line 172, and the connection electrode 1175.

The data line 171 and the driving voltage line 172 may substantially extend in the pixel column direction. The data line 171 may be connected to the second transistor T2. The driving voltage line 172 may be connected to the fifth transistor T5. The driving voltage line 172 may be connected to the storage electrode 1153 through the contact hole 165. The driving voltage ELVDD may be transmitted to the storage electrode 1153.

The connection electrode 1175 may be connected to the gate electrode 1151 of the first driving transistor through an opening of the storage electrode 1153. The connection electrode 1175 may be connected to the third transistor T3 and the fourth transistor T4. The connection electrode 1175 may be connected to the second area of the third transistor T3 and the second area of the fourth transistor T4.

The data conductive layer may additionally include other connection electrodes. The first area of the fourth transistor T4 and the second area of the seventh transistor T7 may be connected to the initialization voltage line 127 by the connection electrodes. There may be a connection electrode overlapping the sixth transistor T6 and connected to the second area of the sixth transistor T6.

The structure in which the driving voltage line 172 is connected to the storage electrode 1153 through the contact hole 165 may correspond to the connection structure in the second display area DAb described with reference to FIG. 2. The structure in which the driving voltage line 172 is connected to the fifth transistor T5 through the contact hole C11 may correspond to the connection structure in the first display area DAa described with reference to FIG. 2. The structure in which one end of the connection electrode 1175 is connected to the gate electrode 1151 of the first driving transistor through the contact hole C13 may correspond to the connection structure in the third display area DAc described with reference to FIG. 2.

The second insulating layer IL2, the first electrode E1, the partition wall IL3, the emission layer EML, and the second electrode E2 may be sequentially positioned on the data conductive layer and the first insulating layer IL1.

Figure 28:
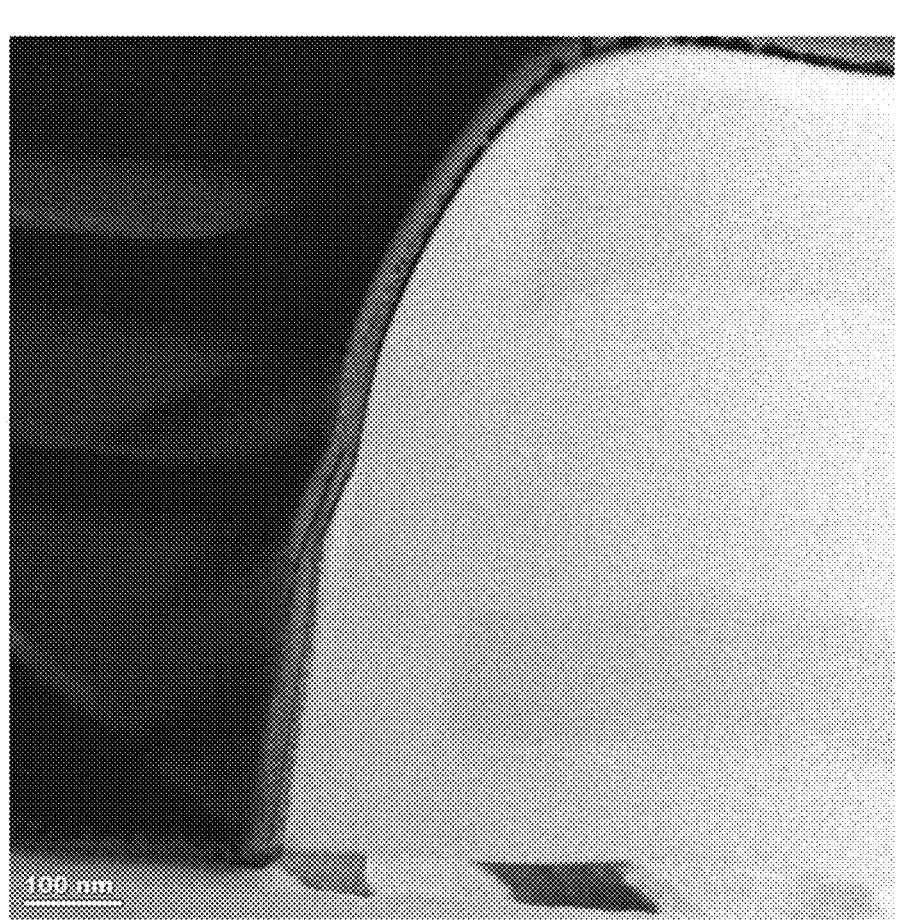
FIG. 28 illustrates a cross-sectional image of an insulating layer according to an embodiment.

FIG. 28 illustrates a cross-sectional image of an insulating layer according to an embodiment. Referring to FIG. 28, the cross-section of the first insulating layer has a smooth curved profile after the etching process over the entire surface/face of the substrate.

According to embodiments, by maintaining portions of the first gate insulating layer that space the semiconductor layer from contact holes when performing the annealing process on the semiconductor layer, it is possible to prevent an unwanted oxide film from being formed on the semiconductor layer. Since no unwanted oxide film is formed on the semiconductor layer, a process for removing an unwanted oxide film may not be performed. In the process of removing the unwanted oxide film, the second gate conductive member or the first gate conductive member exposed by the contact holes may be undesirably short-circuited. According to embodiments, when the display device is manufactured, the undesirably short circuit may be prevented. Advantageously, the reliability of the display device may be satisfactory.

While examples of embodiments have been described, practical embodiments are not limited to the described embodiments. Practical embodiments cover various modifications and equivalent arrangements within the scope of the appended claims.

What is claimed is:

1. A display device comprising:
a semiconductor layer positioned on a substrate;
a first gate insulating layer positioned on the semiconductor layer;
a first gate conductive layer positioned on the first gate insulating layer;
a second gate insulating layer positioned on the first gate conductive layer;
a second gate conductive layer positioned on the second gate insulating layer;
a first insulating layer positioned on the second gate conductive layer;
a first contact hole passing through the first insulating layer, the second gate insulating layer, and the first gate insulating layer;
a second contact hole passing through the first insulating layer; and
a third contact hole passing through the first insulating layer and the second gate insulating layer,
wherein a cross-section of the first insulating layer in a plane perpendicular to the substrate has a curved profile,
the semiconductor layer includes a first groove, and
the first groove is part of the first contact hole.

2. The display device of claim 1, further comprising:
a data conductive layer positioned on the first insulating layer,
wherein the data conductive layer includes:
a source electrode electrically connected to the semiconductor layer through the first contact hole;
a first connection electrode electrically connected to the second gate conductive layer through the second contact hole; and
a second connection electrode electrically connected to the first gate conductive layer through the third contact hole.

3. The display device of claim 2, wherein an interface between the data conductive layer and the first insulating layer includes fluorine, a fluorine-based compound, or CFx, and the x is a natural number of 1 or more.

4. The display device of claim 1, wherein the semiconductor layer includes a first face, a second face, and a third face, the first face is opposite each of the second face and the third face, the second face is exposed by the first contact hole, the semiconductor layer has a first thickness from the first face to the second face, the semiconductor layer has a second thickness from the first face to the third face, and the second thickness is larger than the first thickness.

5. The display device of claim 1, wherein the first gate conductive layer includes a first gate conductive member exposed by the third contact hole, the first gate conductive member includes a first gate conductive sub-member and a second gate conductive sub-member, and the third contact hole extends through the second gate conductive sub-member.

6. The display device of claim 5, wherein the second gate conductive layer includes a second gate conductive member exposed by the second contact hole, the second gate conductive member includes a third gate conductive sub-member and a fourth gate conductive sub-member, and the second contact hole extends through the fourth gate conductive sub-member.

7. The display device of claim 6, wherein each of the first gate conductive sub-member and the third gate conductive sub-member includes aluminum, and each of the second gate conductive sub-member and the fourth gate conductive sub-member includes titanium.

8. The display device of claim 2, further comprising:

an auxiliary layer positioned between the data conductive layer and the first insulating layer.

9. The display device of claim 8, wherein the auxiliary layer includes amorphous silicon.

* * * * *